United States Patent
Ching et al.

(10) Patent No.: US 10,868,001 B2
(45) Date of Patent: Dec. 15, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Kuo-Cheng Ching, Zhubei (TW); Chih-Hao Wang, Baoshan Township (TW); Chih-Liang Chen, Hsinchu (TW); Shi Ning Ju, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/370,611

(22) Filed: Mar. 29, 2019

(65) Prior Publication Data

US 2019/0229120 A1   Jul. 25, 2019

Related U.S. Application Data

(63) Continuation of application No. 16/036,888, filed on Jul. 16, 2018, now Pat. No. 10,269,798, which is a (Continued)

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823418* (2013.01); *H01L 21/823431* (2013.01);
(Continued)

(58) Field of Classification Search
CPC ............ H01L 27/0886; H01L 27/0924; H01L 21/823431; H01L 21/823487;
(Continued)

(56) References Cited

U.S. PATENT DOCUMENTS 9,530,665 B2   12/2016  Leobandung et al.
9,601,492 B1 *  3/2017  Deng ................. H01L 27/0924
(Continued)

FOREIGN PATENT DOCUMENTS

KR   10-2016-0098195 A    8/2016
KR   10-2016-0140973 A   12/2016

OTHER PUBLICATIONS

Non-final Office Action issued in related U.S. Appl. No. 15/491,206, dated Sep. 1, 2017.
(Continued)

*Primary Examiner* — Hsien Ming Lee
(74) *Attorney, Agent, or Firm* — McDermott Will & Emery LLP

(57) ABSTRACT

In a method of manufacturing a semiconductor device, a separation wall made of a dielectric material is formed between two fin structures. A dummy gate structure is formed over the separation wall and the two fin structures. An interlayer dielectric (ILD) layer is formed over the dummy gate structure. An upper portion of the ILD layer is removed, thereby exposing the dummy gate structure. The dummy gate structure is replaced with a metal gate structure. A planarization operation is performed to expose the separation wall, thereby dividing the metal gate structure into a first gate structure and a second gate structure. The first gate structure and the second gate structure are separated by the separation wall.

20 Claims, 19 Drawing Sheets

Related U.S. Application Data continuation of application No. 15/491,206, filed on Apr. 19, 2017, now Pat. No. 10,026,737.

(60) Provisional application No. 62/440,800, filed on Dec. 30, 2016.

(51) Int. Cl.
*H01L 29/66* (2006.01)
*H01L 29/06* (2006.01)
*H01L 29/78* (2006.01)
*H01L 21/8238* (2006.01)

(52) U.S. Cl.
CPC ........ *H01L 21/823468* (2013.01); *H01L 21/823481* (2013.01); *H01L 21/823821* (2013.01); *H01L 29/0649* (2013.01); *H01L 29/66545* (2013.01); *H01L 29/785* (2013.01); *H01L 21/823437* (2013.01)

(58) Field of Classification Search
CPC ..... H01L 21/823821; H01L 21/823885; H01L 29/66545; H01L 29/785; H01L 29/78642; H01L 29/66795; H01L 29/7926
See application file for complete search history.

(56) References Cited

U.S. PATENT DOCUMENTS

| | | |
|---|---|---|
| 10,026,737 B1 | 7/2018 | Ching et al. |
| 2014/0065828 A1 | 3/2014 | Choi et al. |
| 2015/0008484 A1 | 1/2015 | Cea et al. |
| 2016/0233298 A1 | 8/2016 | Webb et al. |
| 2017/0207126 A1 | 7/2017 | Ching et al. |

OTHER PUBLICATIONS

Notice of Allowance issued in related U.S. Appl. No. 15/491,206, dated Mar. 21, 2018.

Non-final Office Action issued in related U.S. Appl. No. 16/036,888, dated Sep. 27, 2018.

Notice of Allowance issued in related U.S. Appl. No. 16/036,888, dated Feb. 6, 2019.

\* cited by examiner

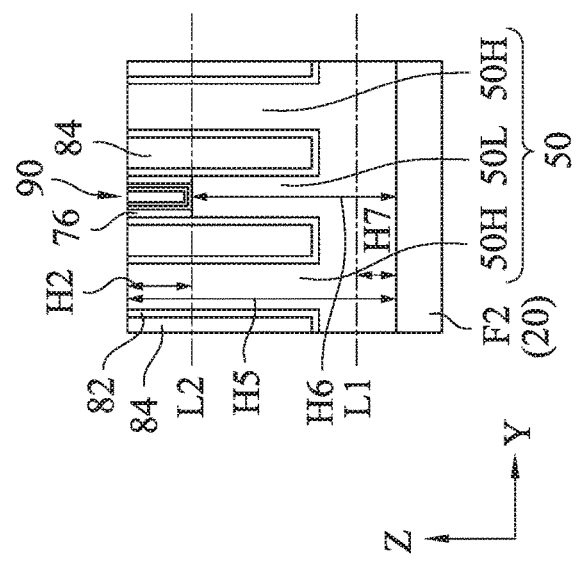
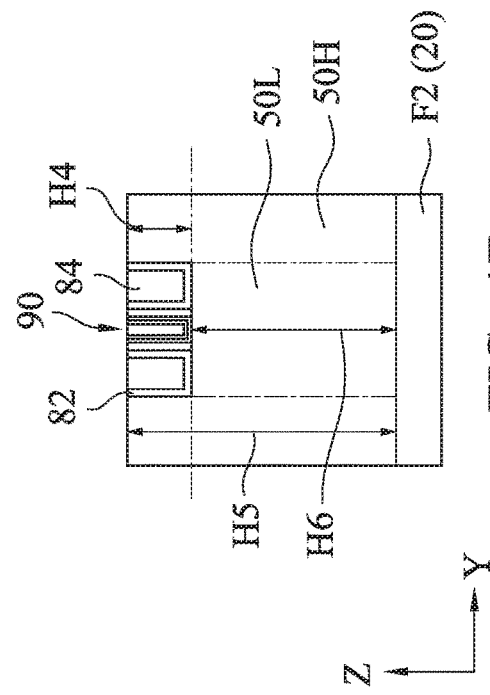
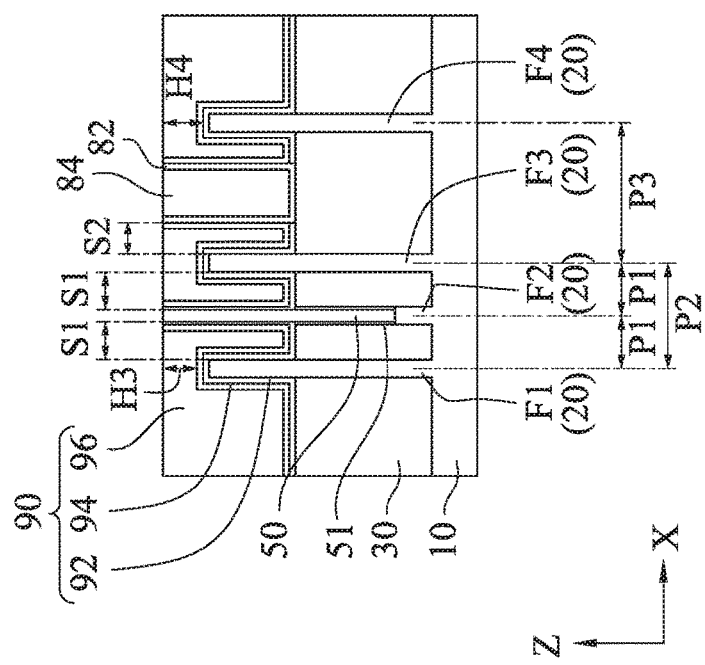
FIG. 1E
FIG. 1F
FIG. 1D

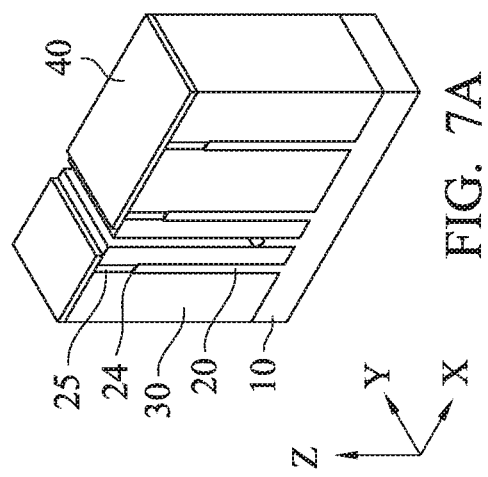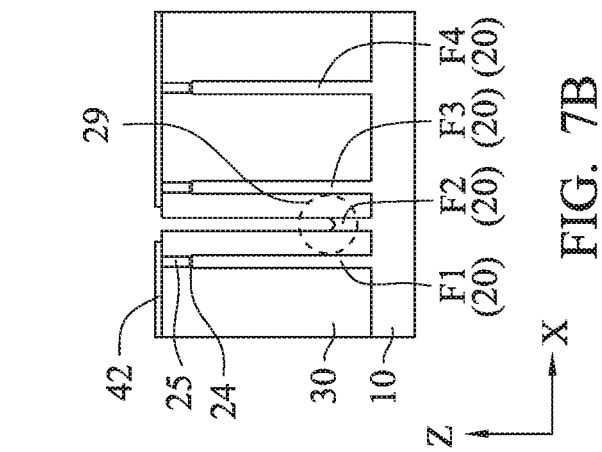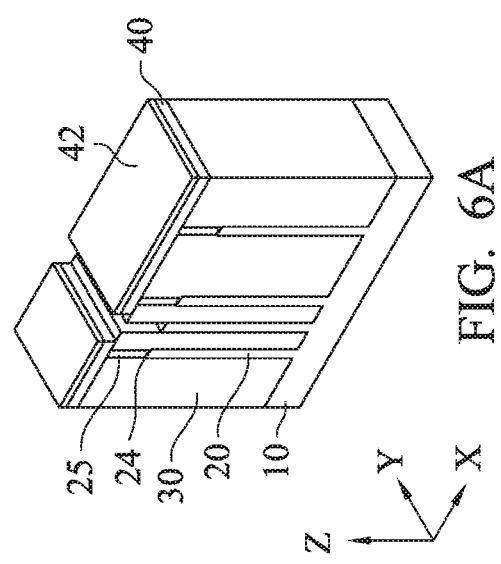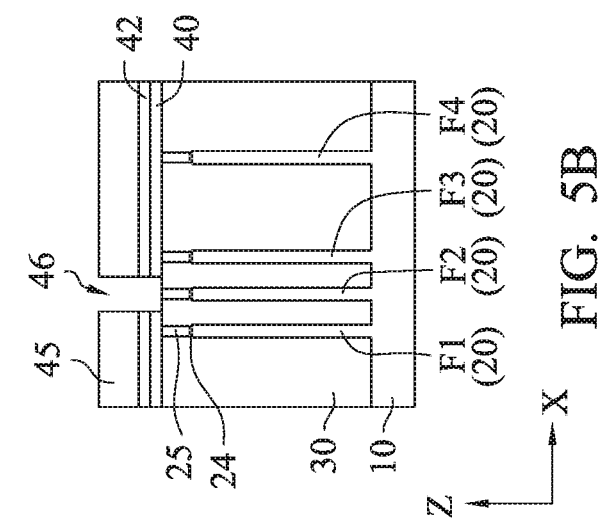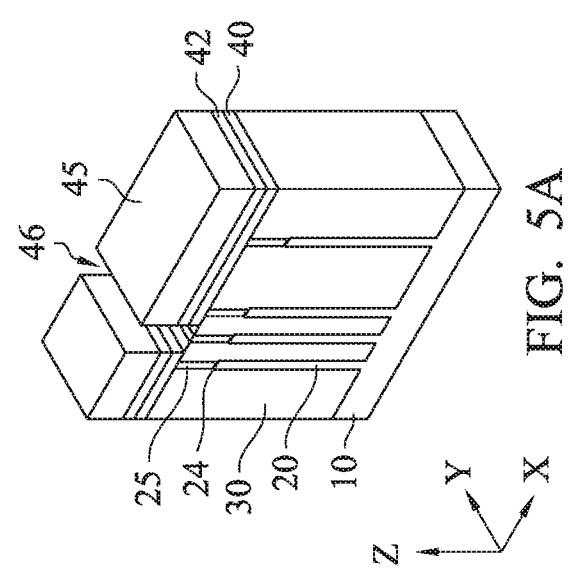

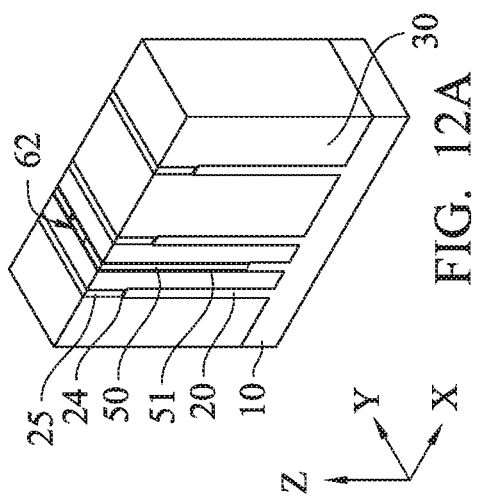
FIG. 11A
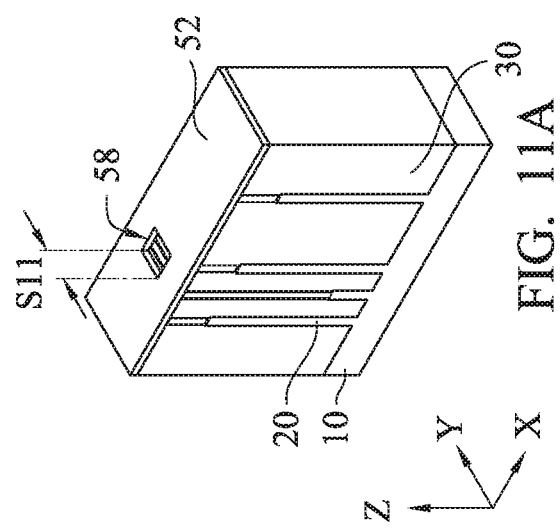
FIG. 11B
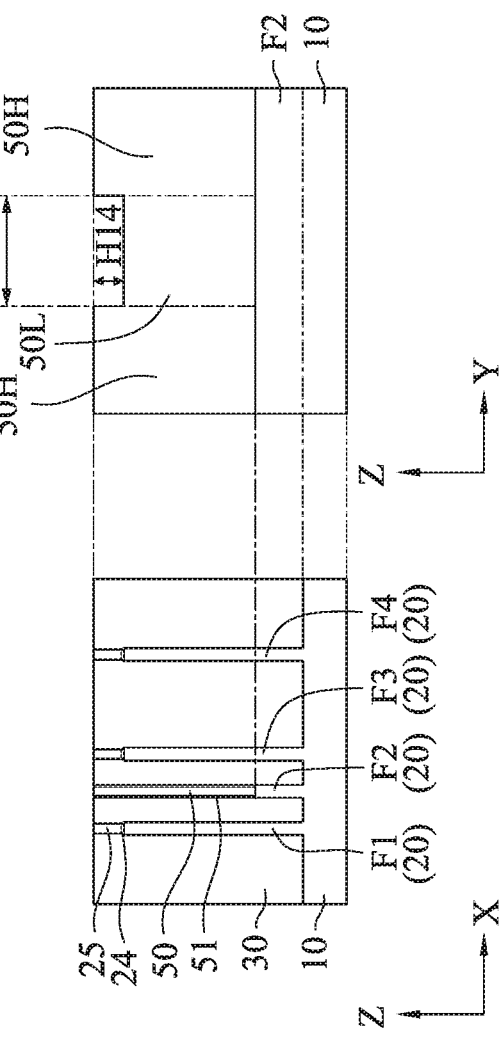
FIG. 12A
FIG. 12B
FIG. 12C

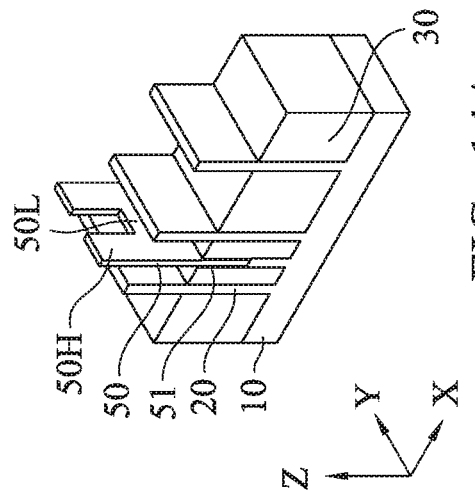
FIG. 13A
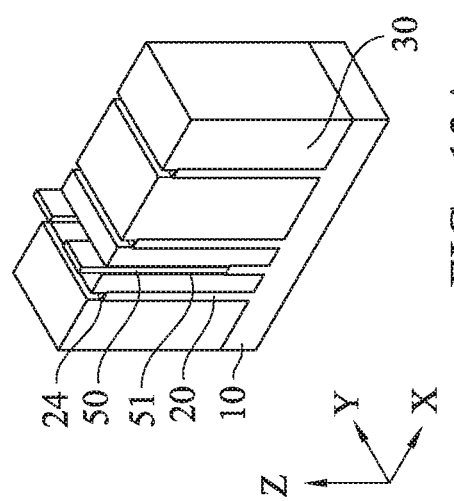
FIG. 13B
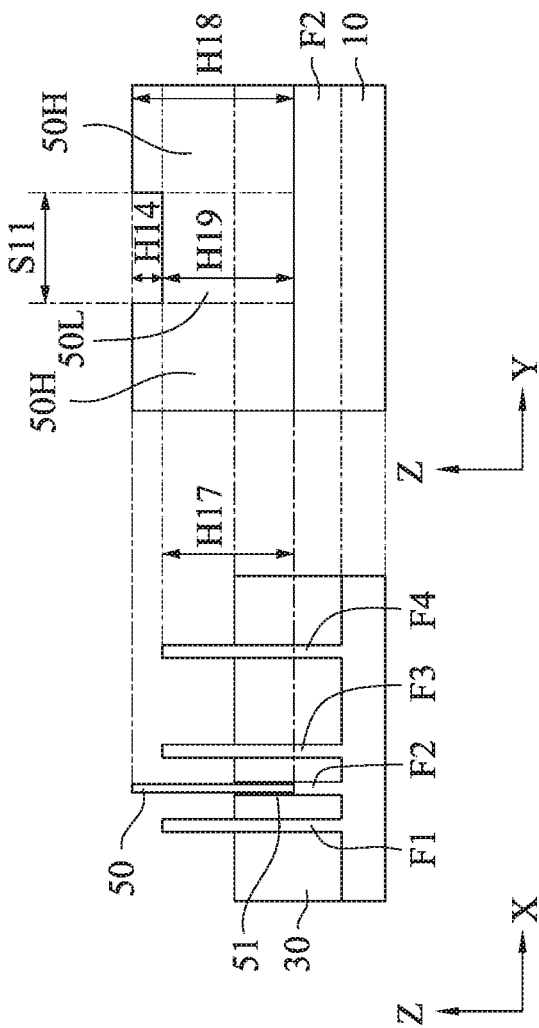
FIG. 14A
FIG. 14B
FIG. 14C

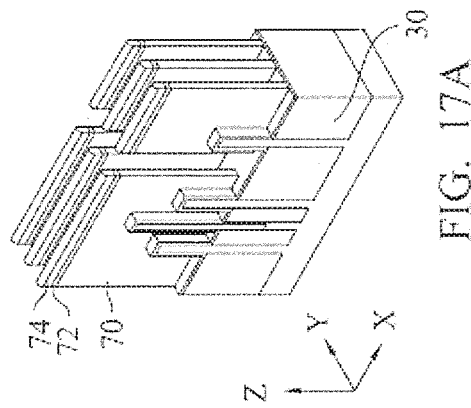
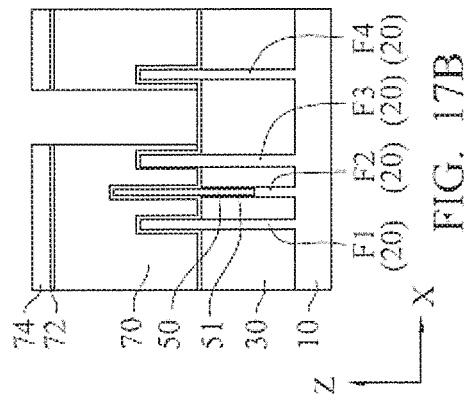
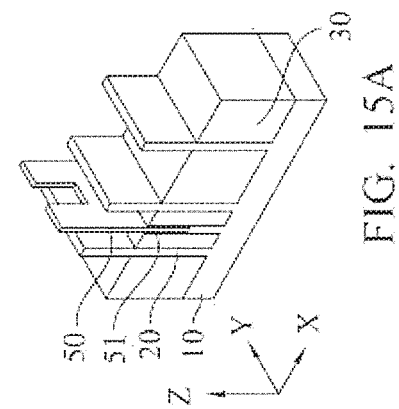
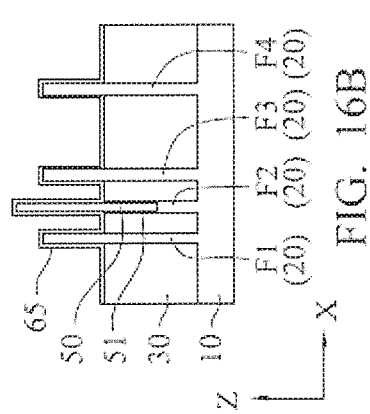
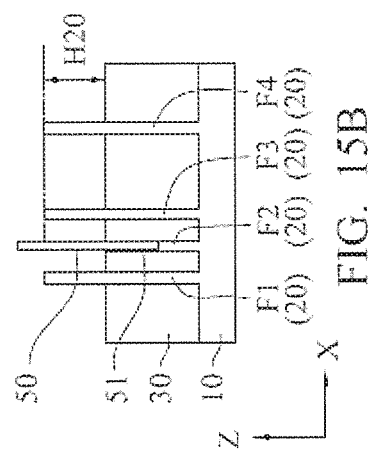

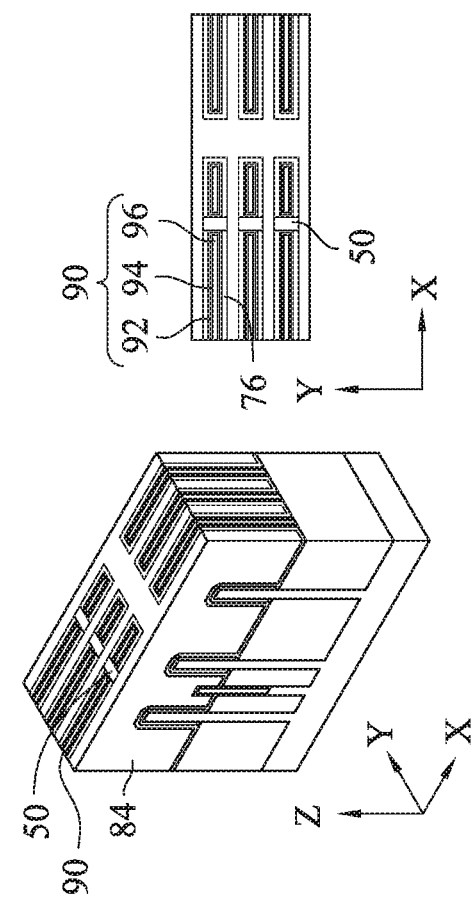
FIG. 21A
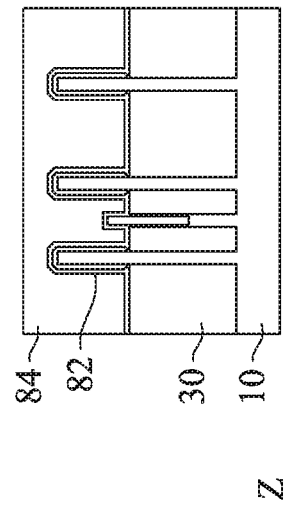
FIG. 21B
FIG. 21C
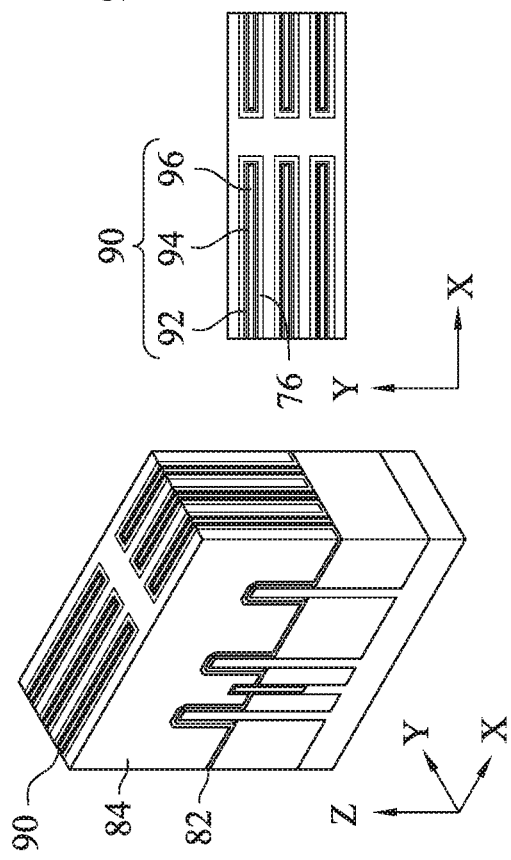
FIG. 22A
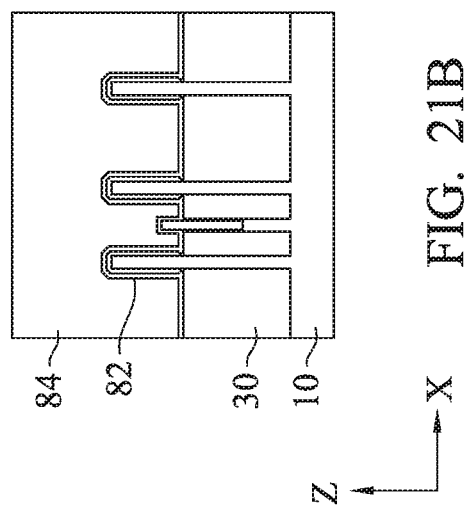
FIG. 22B
FIG. 22C

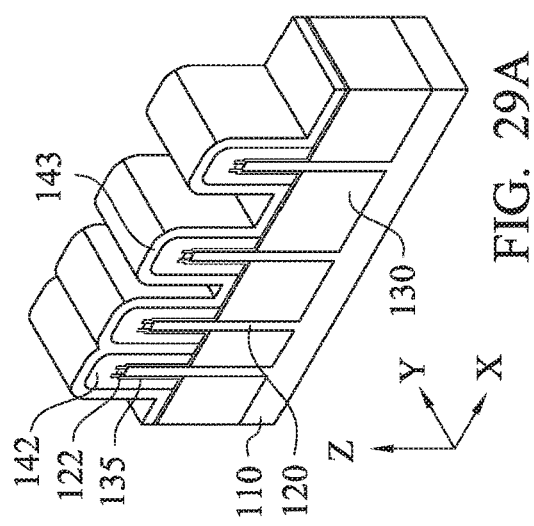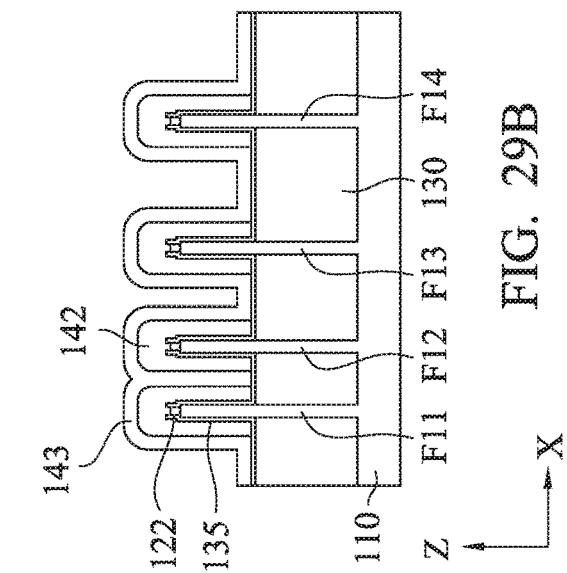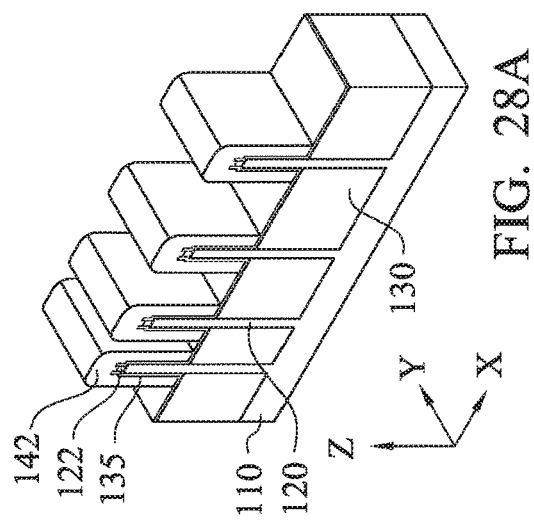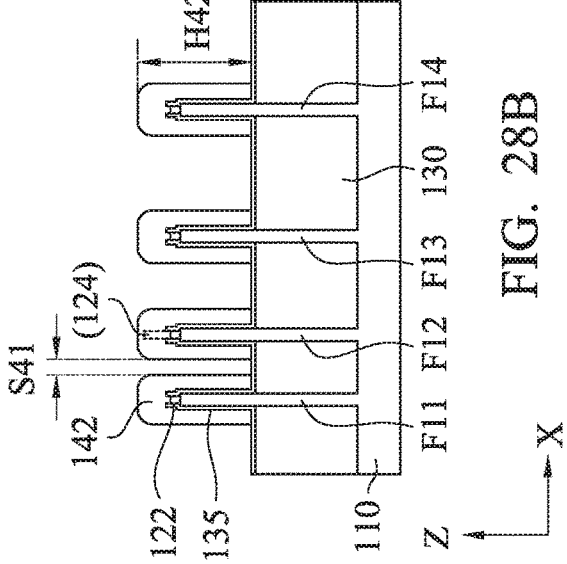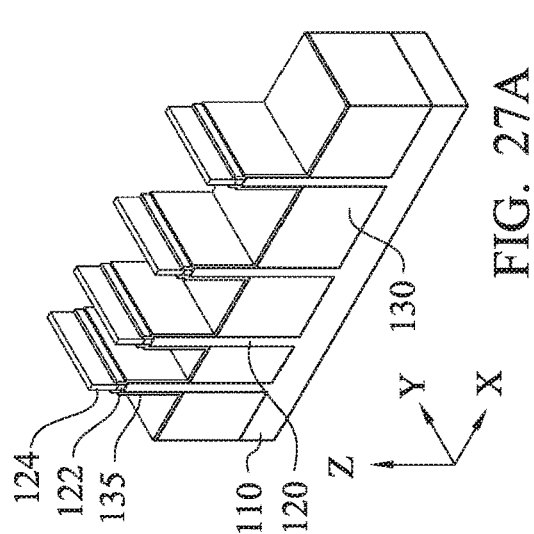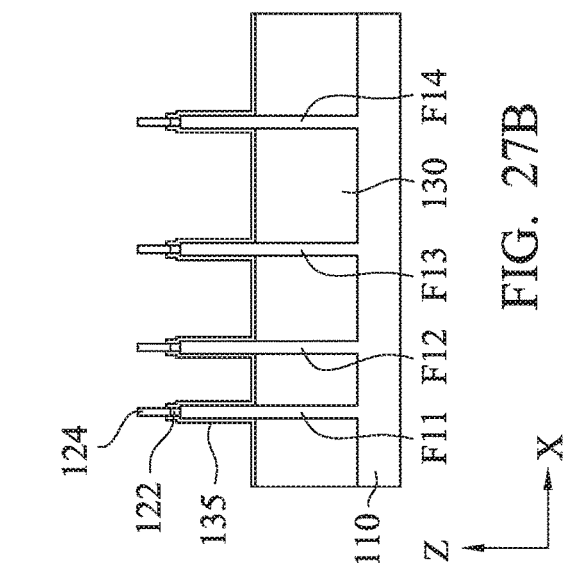

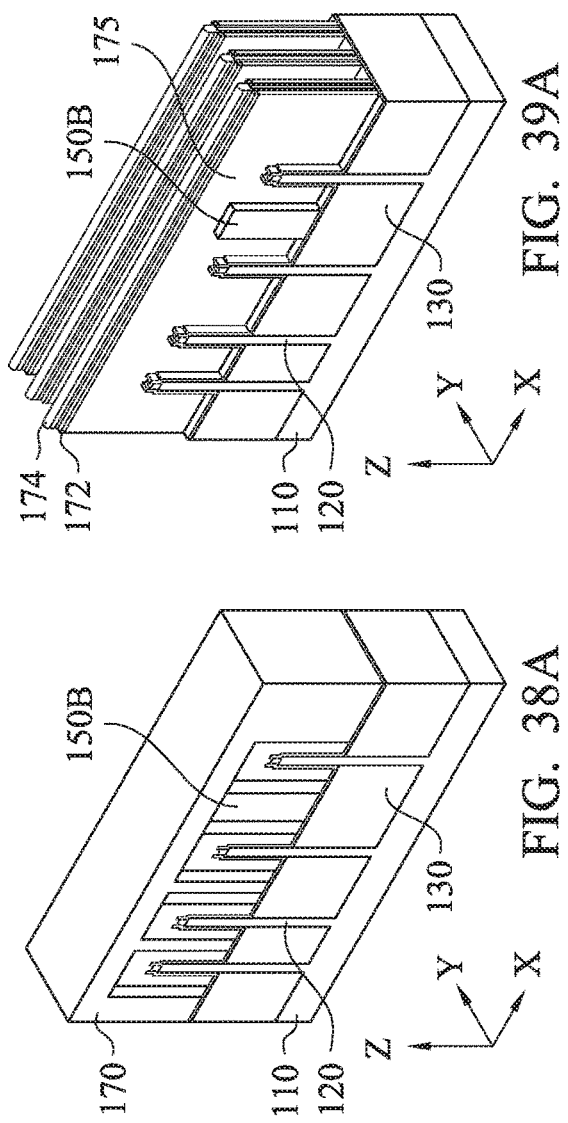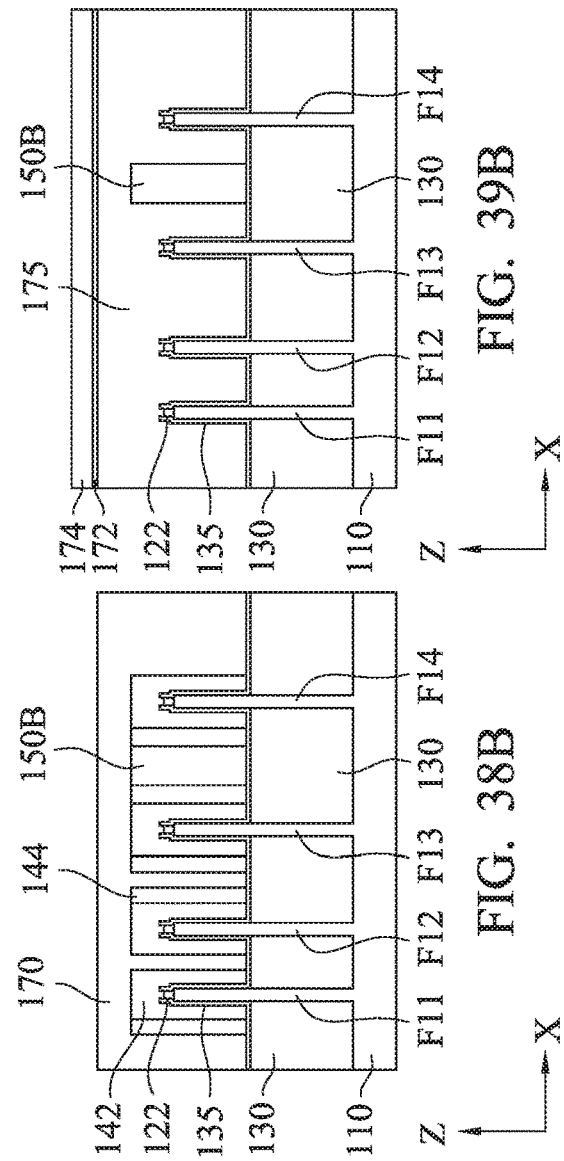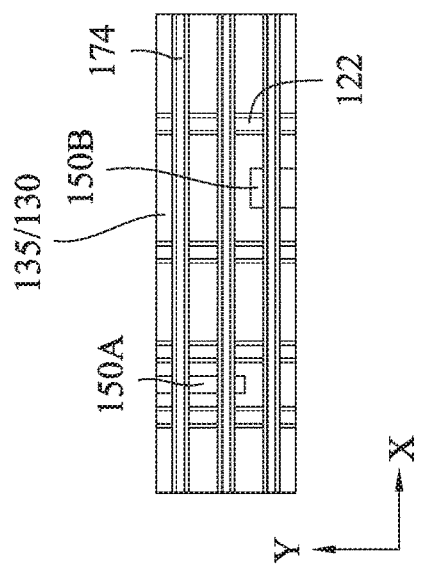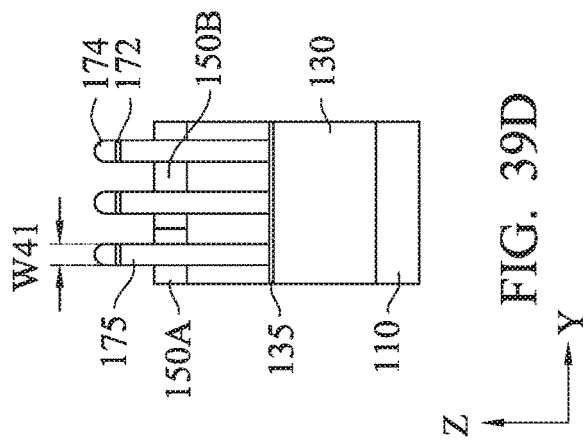

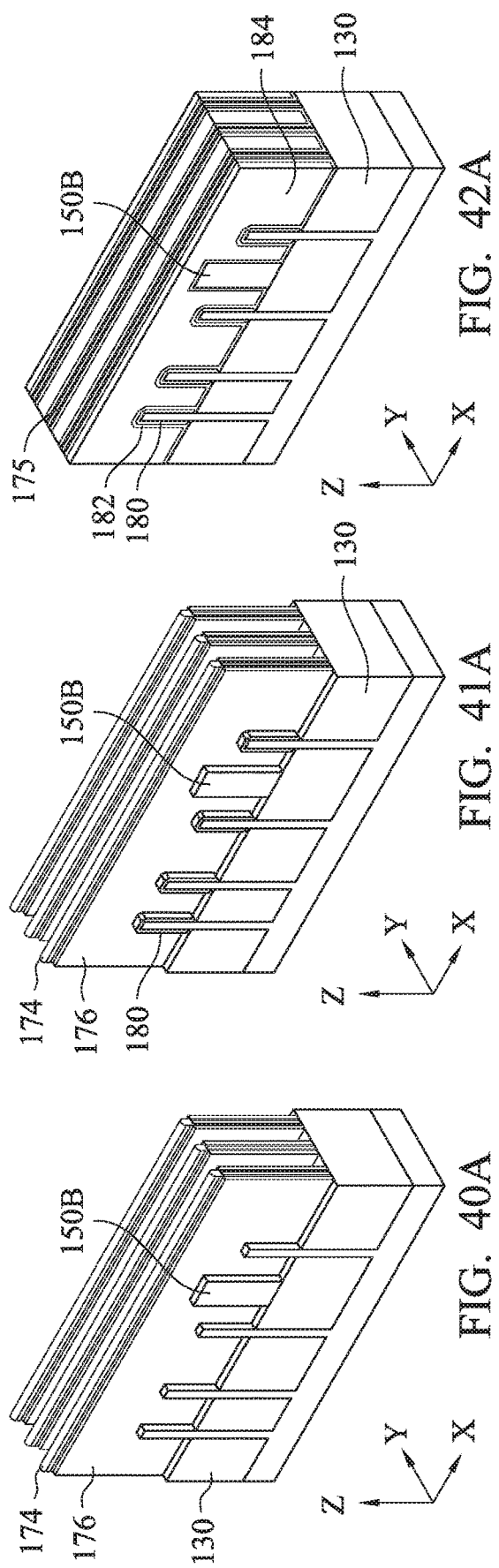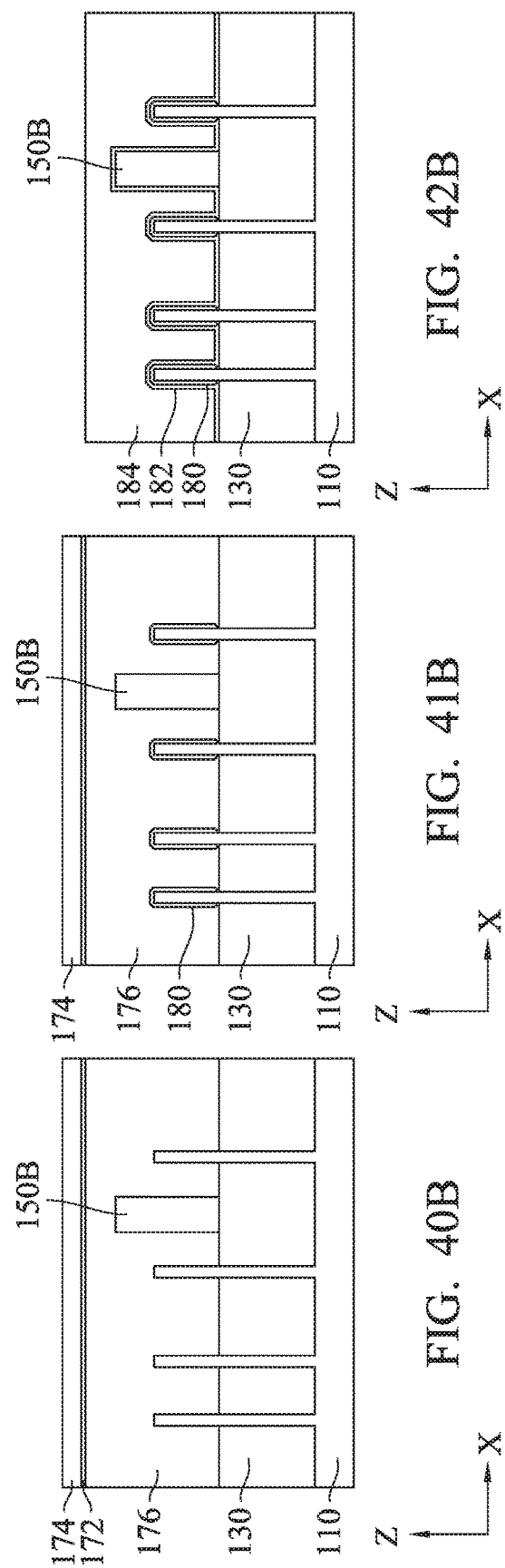

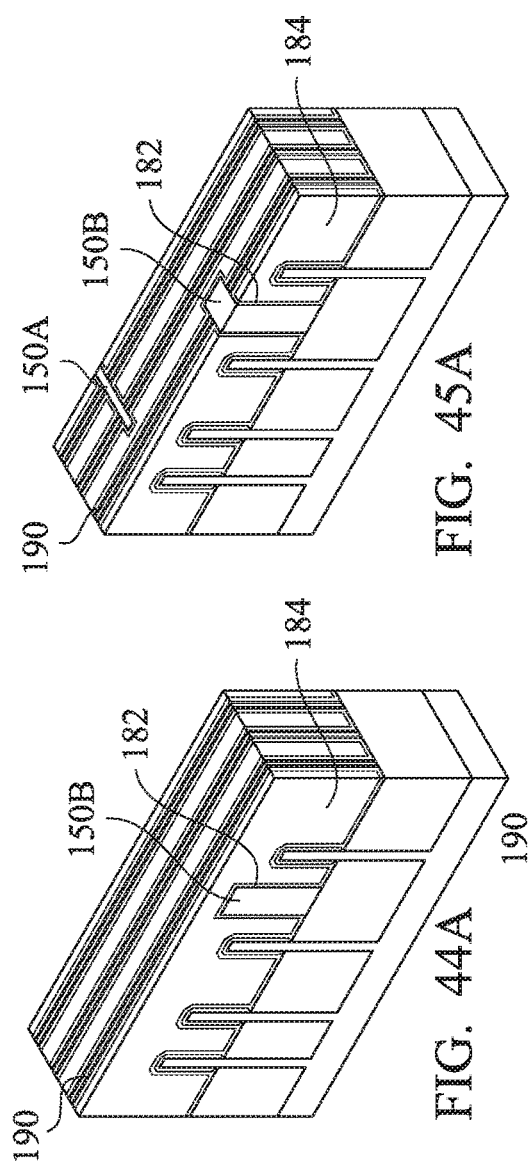
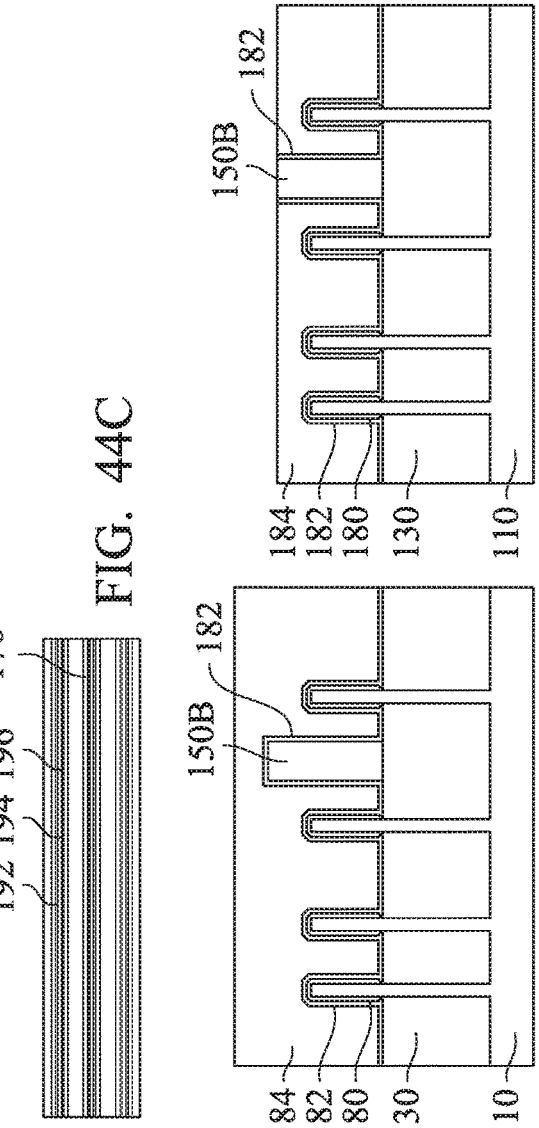

SEMICONDUCTOR DEVICE AND MANUFACTURING METHOD THEREOF

CROSS-REFERENCE TO RELATED APPLICATIONS

This application is a continuation of U.S. application Ser. No. 16/036,888 filed on Jul. 16, 2018, now U.S. Pat. No. 10,269,798, which is a continuation of U.S. application Ser. No. 15/491,206 filed on Apr. 19, 2017, now. U.S. Pat. No. 10,026,737, which claims priority to U.S. Provisional Patent Application 62/440,800 filed Dec. 30, 2016, the entire disclosure of each of which is incorporated herein by reference.

TECHNICAL FIELD

The disclosure relates to a semiconductor integrated circuit, and more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structures (e.g., wrapping) utilizing the advantage of the increased surface area of the channel and source/drain regions to produce faster, more reliable and better-controlled semiconductor transistor devices. A metal gate structure together with a high-k gate dielectric having a high electric dielectric constant is often used in Fin FET device, and is fabricated by a gate-replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1D shows a cross sectional view corresponding to line X2-X2 of FIG. 1B according to some embodiments of the present disclosure. FIG. 1E shows a cross sectional view corresponding to line Y1-Y1 of FIG. 1B according to some embodiments of the present disclosure. FIG. 1F shows a cross sectional view corresponding to line Y1-Y1 of FIG. 1B according to other embodiments of the present disclosure.

FIG. 5A is a perspective view and FIG. 5B is a cross sectional view corresponding to line X1-X1 of FIG. 1B, both of which illustrate one of various stages of a sequential semiconductor device manufacturing process according to some embodiments of the present disclosure.

FIG. 6A is a perspective view and FIG. 6B is a cross sectional view corresponding to line X1-X1 of FIG. 1B, both of which illustrate one of various stages of a sequential semiconductor device manufacturing process according to some embodiments of the present disclosure.

FIG. 7A is a perspective view and FIG. 7B is a cross sectional view corresponding to line X1-X1 of FIG. 1B, both of which illustrate one of various stages of a sequential semiconductor device manufacturing process according to some embodiments of the present disclosure.

FIG. 11A is a perspective view and FIG. 11B is a cross sectional view corresponding to line X1-X1 of FIG. 1B, both of which illustrate one of various stages of a sequential semiconductor device manufacturing process according to some embodiments of the present disclosure.

FIG. 12A is a perspective view, FIG. 12B is a cross sectional view corresponding to line X1-X1 of FIG. 1B and FIG. 12C is a cross sectional view corresponding to line Y1-Y1 of FIG. 1B, all of which illustrate one of various stages of a sequential semiconductor device manufacturing process according to some embodiments of the present disclosure.

FIG. 13A is a perspective view and FIG. 13B is a cross sectional view corresponding to line X1-X1 of FIG. 1B, both of which illustrate one of various stages of a sequential semiconductor device manufacturing process according to some embodiments of the present disclosure.

FIG. 14A is a perspective view, FIG. 14B is a cross sectional view corresponding to line X1-X1 of FIG. 1B and FIG. 14C is a cross sectional view corresponding to line Y1-Y1 of FIG. 1B, all of which illustrate one of various stages of a sequential semiconductor device manufacturing process according to some embodiments of the present disclosure.

FIG. 15A is a perspective view and FIG. 15B is a cross sectional view corresponding to line X1-X1 of FIG. 1B, both of which illustrate one of various stages of a sequential semiconductor device manufacturing process according to some embodiments of the present disclosure.

FIG. 16A is a perspective view and FIG. 16B is a cross sectional view corresponding to line X1-X1 of FIG. 1B, both of which illustrate one of various stages of a sequential semiconductor device manufacturing process according to some embodiments of the present disclosure.

FIG. 17A is a perspective view and FIG. 17B is a cross sectional view corresponding to line X1-X1 of FIG. 1B, both of which illustrate one of various stages of a sequential semiconductor device manufacturing process according to some embodiments of the present disclosure.

FIG. 21A is a perspective view, FIG. 21B is a cross sectional view corresponding to line X1-X1 of FIG. 1B and FIG. 21C is a plan view, all of which illustrate one of various stages of a sequential semiconductor device manufacturing process according to some embodiments of the present disclosure.

FIG. 22A is a perspective view, FIG. 22B is a cross sectional view corresponding to line X1-X1 of FIG. 1B and FIG. 22C is a plan view, all of which illustrate one of various stages of a sequential semiconductor device manufacturing process according to some embodiments of the present disclosure.

FIG. 27A is a perspective view and FIG. 27B is a cross sectional view corresponding to line X12-X12 of FIG. 23B, both of which illustrate one of various stages of a sequential semiconductor device manufacturing process according to some embodiments of the present disclosure.

FIG. 28A is a perspective view and FIG. 28B is a cross sectional view corresponding to line X12-X12 of FIG. 23B, both of which illustrate one of various stages of a sequential semiconductor device manufacturing process according to some embodiments of the present disclosure.

FIG. 29A is a perspective view and FIG. 29B is a cross sectional view corresponding to line X12-X12 of FIG. 23B, both of which illustrate one of various stages of a sequential semiconductor device manufacturing process according to some embodiments of the present disclosure.

FIG. 38A is a perspective view and FIG. 38B is a cross sectional view corresponding to line X12-X12 of FIG. 23B, both of which illustrate one of various stages of a sequential semiconductor device manufacturing process according to some embodiments of the present disclosure.

FIG. 39A is a perspective view, FIG. 39B is a cross sectional view corresponding to line X12-X12 of FIG. 23B, FIG. 39C is a plan view and FIG. 39D is a side view seen along Y direction, all of which illustrate one of various stages of a sequential semiconductor device manufacturing process according to some embodiments of the present disclosure.

FIG. 40A is a perspective view and FIG. 40B is a cross sectional view corresponding to line X12-X12 of FIG. 23B, both of which illustrate one of various stages of a sequential semiconductor device manufacturing process according to some embodiments of the present disclosure.

FIG. 41A is a perspective view and FIG. 41B is a cross sectional view corresponding to line X12-X12 of FIG. 23B, both of which illustrate one of various stages of a sequential semiconductor device manufacturing process according to some embodiments of the present disclosure.

FIG. 42A is a perspective view and FIG. 42B is a cross sectional view corresponding to line X12-X12 of FIG. 23B, both of which illustrate one of various stages of a sequential semiconductor device manufacturing process according to some embodiments of the present disclosure.

FIG. 43A is a perspective view and FIG. 43B is a cross sectional view corresponding to line X12-X12 of FIG. 23B, both of which illustrate one of various stages of a sequential semiconductor device manufacturing process according to some embodiments of the present disclosure.

FIG. 44A is a perspective view, FIG. 44B is a cross sectional view corresponding to line X12-X12 of FIG. 23B and FIG. 44C is a plan view, all of which illustrate one of various stages of a sequential semiconductor device manufacturing process according to some embodiments of the present disclosure.

FIG. 45A is a perspective view and FIG. 45B is a cross sectional view corresponding to line X12-X12 of FIG. 23B, both of which illustrate one of various stages of a sequential semiconductor device manufacturing process according to some embodiments of the present disclosure.

DETAILED DESCRIPTION

Figure 1B:
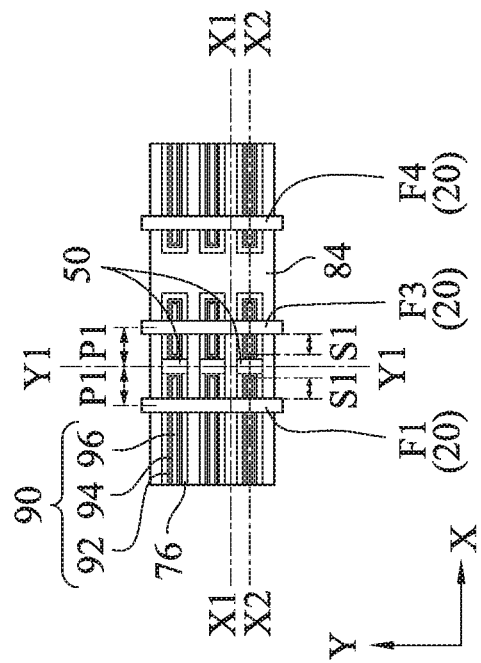
FIG. 1B shows a plan view of a semiconductor device according to some embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

FIGS. 1A-1E show various views of a semiconductor fin field effect transistor (FinFET) according to some embodiments of the present disclosure.

In the present disclosure, two gate patterns extending and aligned along the X direction are physically separated by a separation wall made of a dielectric material. As shown in FIGS. 1A-1E, a semiconductor device includes a substrate 10, semiconductor fins 20 and gate structures 90. The bottom of the semiconductor fins 20 are embedded in an isolation insulating layer 30, which is also called shallow trench isolation (STI). In FIGS. 1A-1E, four fins F1, F2, F3 and F4 are disposed over the substrate 10, but the number of the fins is not limited to four. Some of the gate structures 90 are physically separated by separation walls 50 made of a dielectric material. The separation wall 50 is further covered by a first cover layer 51 in some embodiments. On opposing sides of the gate structure 90, sidewall spacers 76 are disposed. The gate structures 90 include a gate dielectric layer 92, a work function adjustment layer 94 and a body gate electrode 96.

The fins 20 not covered by the gate structures 90 are source/drain (S/D) regions. An epitaxial layer 80 is formed on the S/D regions of the fins 20 and an etch stop layer (ESL) 82 is formed over the epitaxial layer 80. Further, an interlayer dielectric (ILD) layer 84 is formed to cover the S/D structures.

In FIGS. 1A-1E, the fin structures 20 includes first F1, second F2, third F3 and fourth F4 fin structures disposed in this order, in some embodiments. The fin F2 is a dummy fin, on which the separation wall 50 is formed. When a pitch P1 between the first fin F1 and second fin F2 is FP, a pitch P2 between the first fin F1 and the third fin F3 is 2FP and a pitch P3 between the third fin F3 and the fourth fin F4 is 3FP or more, in some embodiments. The fin pitch P1 is about 14 nm to 30 nm in some embodiments.

Figure 1C:
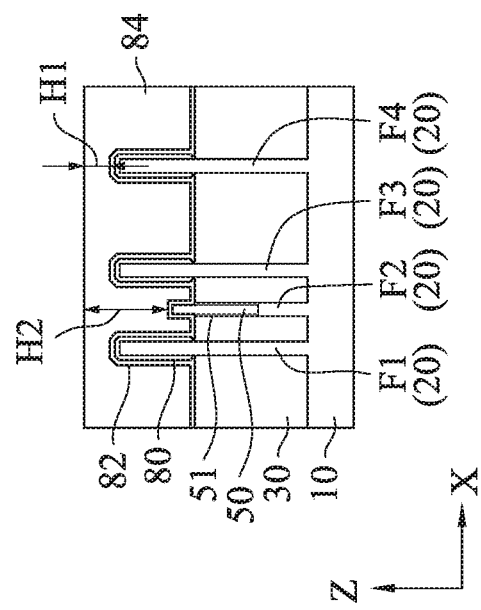
FIG. 1C shows a cross sectional view corresponding to line X1-X1 of FIG. 1B.
Figure 1A:
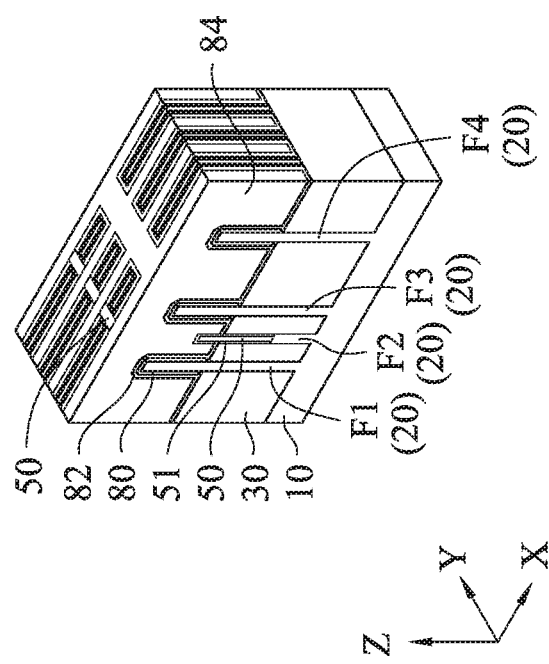
FIG. 1A shows a perspective view of a semiconductor device according to some embodiments of the present disclosure.

As shown in FIGS. 1C and 1D, the distance H1 between the ESL 82 on the S/D region and the upper surface of the ILD layer 84 is in a range from about 14 nm to about 30 nm in some embodiments. The distance H2 between the ESL 82 on the dielectric separation wall 50 and the upper surface of the ILD layer 84 is in a range from about 20 nm to about 50 nm in some embodiments. The distance H3 between the work function adjustment layer 94 on the fin F1 and the upper surface of the body gate electrode 96 is in a range from about 14 nm to about 30 nm in some embodiments. The distance H4 between the top of the fin F1 and the upper surface of the body gate electrode 96 is in a range from about 18 nm to about 40 nm in some embodiments.

In FIGS. 1A-1E, a minimum distance 51 between the dielectric separation wall 50 and the adjacent fin is substantially equal to a space between the fins. The distance 51 may be multiple of the fin space. The width of the dielectric separation well 50 is substantially equal to or slightly smaller than a fin width (e.g., 5-10 nm).

The width of the dielectric separation wall 50 is about 4 nm to about 8 nm in some embodiments. The minimum distance S1 (see, FIGS. 1B and 1C) between the dielectric separation wall 50 and the adjacent fin (F1 or F3) is about 8 nm to about 16 nm in some embodiments. Further, the space S2 between the third fin F3 and the ESL 82, i.e., the end of the gate structure, is in a range from about 8 nm to about 16 nm in some embodiments.

As shown in FIGS. 1C and 1D, the bottom of the dielectric separation wall 50 is below the isolation insulating layer 30. In FIG. 1E, the line L1 corresponds to the upper surface of the isolation insulating layer 30. The separation wall 50 includes a separation portions 50H and a dummy portion 50L to avoid collapse as shown in FIG. 1E. The gate structure 90 extends over the dummy portion 50L of the dielectric separation wall 50, and the gate connection is made only at the top of metal gate. In this embodiment, there are "valley" portions having a smaller height than the dummy portion between the separation portion 50H and dummy portion 50L.

In FIG. 1E, the height H5 of the separation portion 50H measured from the top of fin F2 is in a range from about 80 nm to about 120 nm in some embodiments. The height H6 of the dummy portion 50L measured from the top of fin F2 is in a range from about 60 nm to about 100 nm in some embodiments. The bottom portion of the dielectric separation wall 50 embedded in the isolation insulating layer 30 (H7) is in a range from about 5 nm to about 30 nm in some embodiments.

The materials of the dielectric separation wall 50 can be SiCN, SiOCN and metal oxide, such as $HfO_2$, $ZrO_2$ and $Al_2O_3$, or any suitable dielectric material. In some embodiments, SiCN is used as the dielectric separation wall 50.

FIG. 1F is another embodiment of the present disclosure. In this embodiment, there is no "valley" portion between the separation portion 50H and dummy portion 50L.

FIGS. 2A-22C show various stages of a sequential semiconductor device manufacturing process according to some embodiments of the present disclosure. In FIGS. 2A-22C, the "A" figures (e.g., FIGS. 1A, 2A, etc.) illustrate a perspective view, the "B" figures (e.g., FIGS. 1B, 2B, etc.) illustrate a cross-sectional view along the X direction corresponding to line X1-X1 of FIG. 1B, and the "C" figures (e.g., FIG. 21C, etc.) illustrate a plan view. It is understood that additional operations can be provided before, during, and after processes shown by FIGS. 2A-22C, and some of the operations described below can be replaced or eliminated, for additional embodiments of the method. The order of the operations/processes may be interchangeable.

Figure 2A:
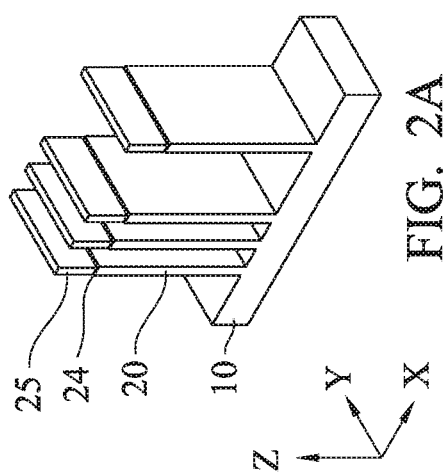
FIG. 2A is a perspective view and FIG. 2B is a cross sectional view corresponding to line X1-X1 of FIG. 1B, both of which illustrate one of various stages of a sequential semiconductor device manufacturing process according to some embodiments of the present disclosure.
Figure 2B:
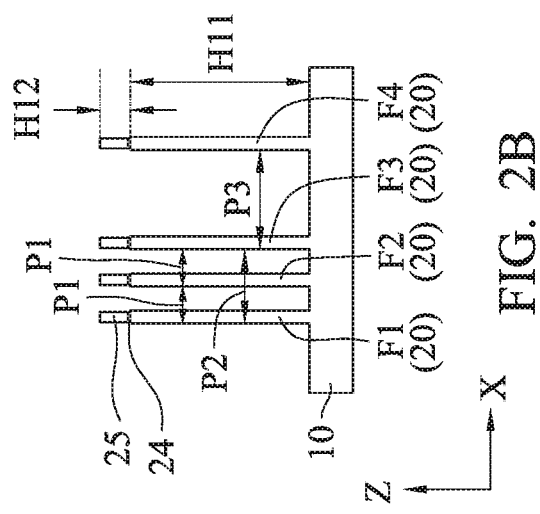

In FIGS. 2A and 2B, fin structures 20 are formed over a substrate 10. To fabricate a fin structures, a mask layer is formed over the substrate (e.g., a semiconductor wafer) by, for example, a thermal oxidation process and/or a chemical vapor deposition (CVD) process. The substrate is, for example, a p-type silicon substrate with an impurity concentration being in a range from about $1\times10^{15}$ $cm^{-3}$ and about $5\times10^{15}$ $cm^{-3}$. In other embodiments, The substrate is an n-type silicon substrate with an impurity concentration being in a range from about $1\times10^{15}$ $cm^{-3}$ and about $5\times10^{15}$ $cm^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AnnAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer includes, for example, a pad oxide 24 (e.g., silicon oxide) layer and a silicon nitride mask layer 25 in some embodiments. The pad oxide layer 24 may be formed by using thermal oxidation or a CVD process. The silicon nitride mask layer 25 may be formed by a physical vapor deposition (PVD), such as sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 24 is in a range from about 2 nm to about 15 nm and the thickness of the silicon nitride mask layer 25 is in a range from about 2 nm to about 50 nm in some embodiments. A mask pattern is further formed over the mask layer. The mask pattern is, for example, a photo resist pattern formed by photo lithography.

By using the mask pattern as an etching mask, a hard mask pattern of the pad oxide layer 24 and the silicon nitride mask layer 25 is formed.

By using the hard mask pattern as an etching mask, the substrate 10 is patterned into fin structures 20 by trench etching using a dry etching method and/or a wet etching method.

The fin structures 20 disposed over the substrate 10 are made of the same material as the substrate 10 and continuously extend from the substrate 10 in one embodiment. The fin structures 20 may be intrinsic, or appropriately doped with an n-type impurity or a p-type impurity.

In the figures, four fin structures 20 are disposed. These fin structures are used for a p-type Fin FET and/or an n-type Fin FET. The number of the fin structures is not limited to four. The numbers may be as small as one, or more than four. In addition, one of more dummy fin structures may be disposed adjacent both sides of the fin structures 20 to improve pattern fidelity in patterning processes. The width of the fin structures 20 is in a range from about 5 nm to about 30 nm in some embodiments, and is in a range from about 7 nm to about 20 nm in certain embodiments. The height H11 of the fin structures 20 is in a range from about 100 nm to about 300 nm in some embodiments, and is a range of about 50 nm to 100 nm in other embodiments. When the heights of the fin structures are not uniform, the height from the substrate may be measured from the plane that corresponds to the average heights of the fin structures. The height H12 of the mask pattern after the fin etching is about 4 nm to about 50 nm in some embodiments.

Figure 3A:
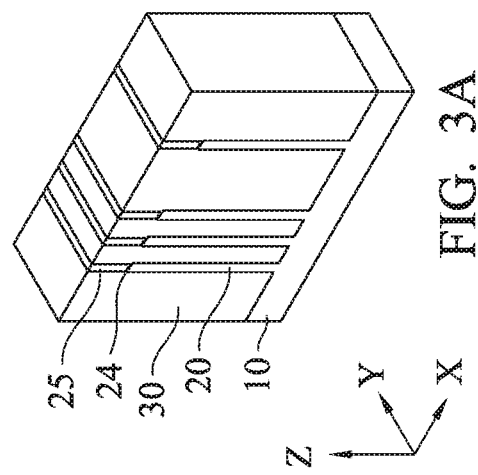
FIG. 3A is a perspective view and FIG. 3B is a cross sectional view corresponding to line X1-X1 of FIG. 1B, both of which illustrate one of various stages of a sequential semiconductor device manufacturing process according to some embodiments of the present disclosure.
Figure 3B:
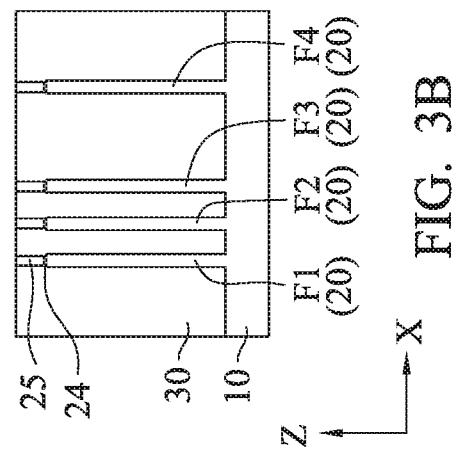

In FIGS. 3A and 3B, an insulating isolation layer 30 (STI) is formed. An insulating material layer to form an isolation insulating layer 30 is formed over the substrate 10 so as to fully cover the fin structures 20.

The insulating material for the isolation insulating layer 30 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The isolation insulating layer 30 may be SOG, SiO, SiON, SiOCN or fluorine-doped silicate glass (FSG). The isolation insulating layer 30 may be doped with boron and/or phosphorous.

Further, a planarization operation, such as a chemical mechanical polishing (CMP) method, is performed, thereby exposing the mask layer 25, as shown in FIGS. 3A and 3B.

Figure 4A:
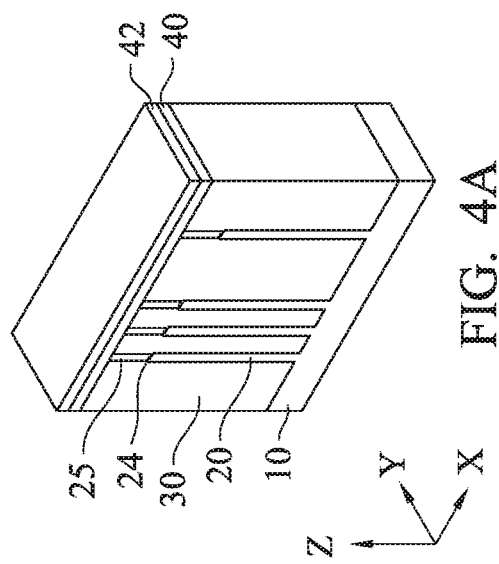
FIG. 4A is a perspective view and FIG. 4B is a cross sectional view corresponding to line X1-X1 of FIG. 1B, both of which illustrate one of various stages of a sequential semiconductor device manufacturing process according to some embodiments of the present disclosure.
Figure 4B:
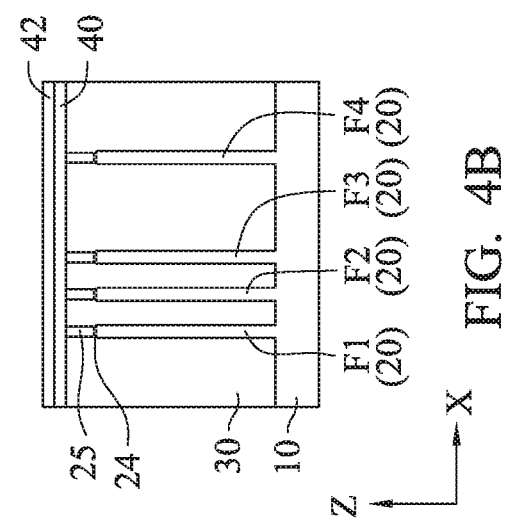

In FIGS. 4A and 4B, a first mask layer 40 is formed on the isolation insulating layer 30 and a second mask layer 42 is formed on the first mask layer 40. The first mask layer 40 includes one or more layers of SiN and SiON. The second mask layer 42 is made of amorphous or poly material of Group IV material, such as amorphous or poly silicon, silicon germanium or germanium. In some embodiments, the first mask layer 40 is SiN with a thickness of about 5 nm to about 30 nm, and the second mask layer 42 is made of amorphous Si with a thickness of about 5 nm to about 30 nm. The first and second mask layers can be formed by CVD, PVD or ALD, or any suitable film forming method.

In FIGS. 5A and 5B, a photo resist layer 45 is formed over the second mask layer 42, and by using lithography and etching operations, a part of the first and second mask layer over the second fin F2 is removed.

In FIGS. 6A and 6B, the mask layers 24 and 25 formed on the second fin F2 are removed by using a suitable etching operation through the opening 46. By this etching, the top surface the second fin F2 is exposed.

In FIGS. 7A and 7B, the second fin F2 is recessed by suitable dry etching. As etched, the upper portion of the fin F2 has a U-shape residue 29, as shown in FIG. 7B.

Figure 8A:
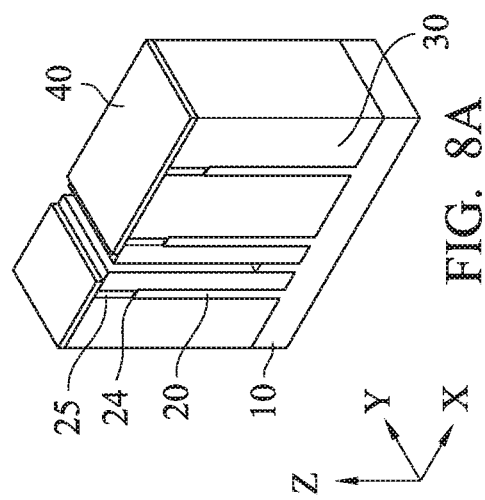
FIG. 8A is a perspective view and FIG. 8B is a cross sectional view corresponding to line X1-X1 of FIG. 1B, both of which illustrate one of various stages of a sequential semiconductor device manufacturing process according to some embodiments of the present disclosure.
Figure 8B:
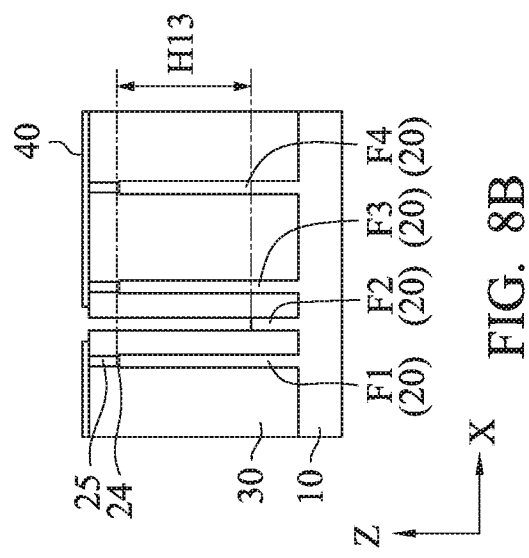

In FIGS. 8A and 8B, the etching residue 29 is removed by suitable wet etching. At this stage of the manufacturing operation, the etched depth H13 of the fin F2 is in a range from about 100 nm to about 300 nm in some embodiments.

Figure 9A:
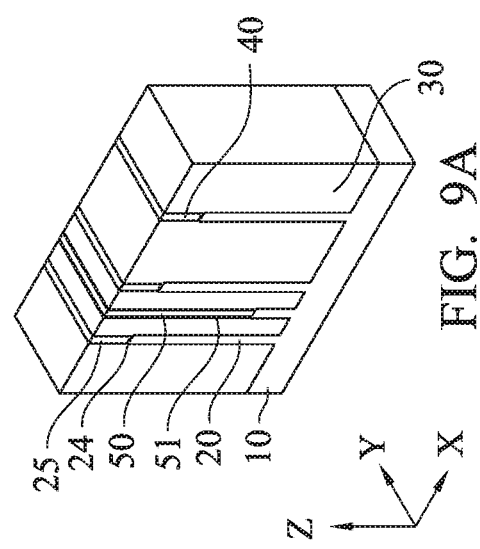
FIG. 9A is a perspective view and FIG. 9B is a cross sectional view corresponding to line X1-X1 of FIG. 1B, both of which illustrate one of various stages of a sequential semiconductor device manufacturing process according to some embodiments of the present disclosure.
Figure 9B:
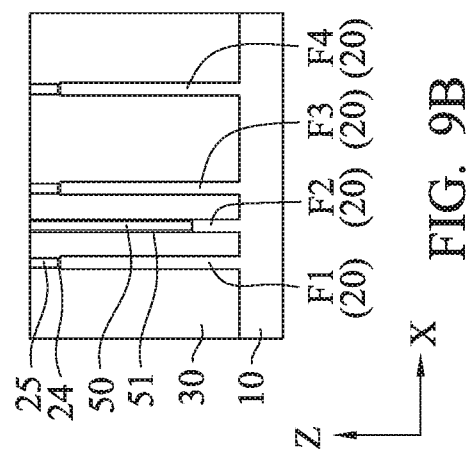

In FIGS. 9A and 9B, a dielectric material for the dielectric separation wall 50 is formed. A blanket layer of the dielectric material is formed by CVD or ALD, and then a CMP or an etch back operation is performed. The dielectric separation wall 50 includes one or more layers of SiN, SiCN, SiOCN and metal oxide, such as $HfO_2$, $ZrO_2$ and $Al_2O_3$, or any suitable dielectric material.

In some embodiments, before forming the dielectric material for the dielectric separation wall 50, a first cover layer 51 is formed. The first cover layer is made of, for example, silicon oxide or other suitable dielectric material, and can be formed by CVD or ALD. The thickness of the first cover layer 51 is in a range from about 0.5 nm to about 2 nm in some embodiments.

Figure 10A:
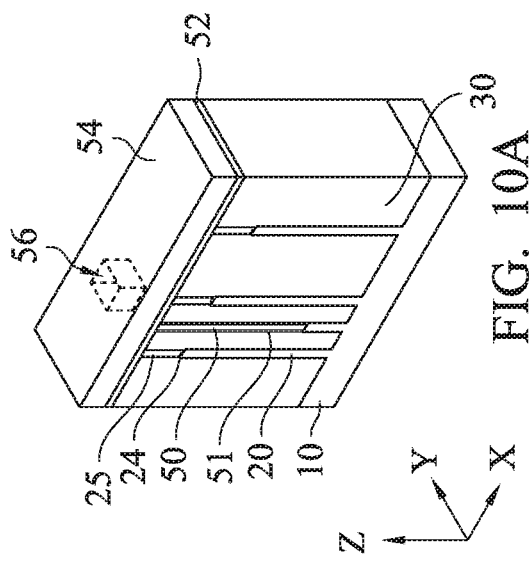
FIG. 10A is a perspective view and FIG. 10B is a cross sectional view corresponding to line X1-X1 of FIG. 1B, both of which illustrate one of various stages of a sequential semiconductor device manufacturing process according to some embodiments of the present disclosure.
Figure 10B:
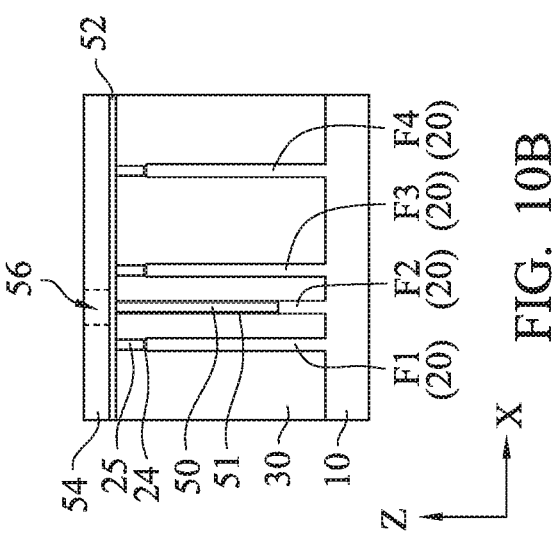

In FIGS. 10A and 10B, a third mask layer 52 is formed over the isolation insulating layer 30 and a resist pattern 54 having an opening 56 is formed. The third mask layer 52 is made of amorphous or poly material of a Group IV material, such as amorphous or poly silicon, silicon germanium or germanium. In some embodiments, the third mask layer 52 is made of amorphous Si with a thickness of about 5 nm to about 30 nm. The size of the opening 56 is substantially the same as a pitch of gates, and is located at a position where a gate is subsequently divided.

In FIGS. 11A and 11B, the third mask layer 52 is etched by using the photo resist pattern 54 as an etching mask, thereby forming an opening 58 in the third mask layer 52 with one gate pitch width. The width S11 of the opening 58 in the Y direction is in a range from about 20 nm to about 50 nm in some embodiments. Then, the photo resist pattern 54 is removed.

In FIGS. 12A-12C, a part of the dielectric separation wall 50 is recessed to form a recess 62 by using the patterned third mask layer 52 as an etching mask. Then, the third mask layer 52 is removed. By this recess etching, the dielectric separation wall 50 has a low portion 50L, which is recessed, and high portions 50H, which are not recessed, as shown in FIG. 12C. The amount of etching H14 is in a range from about 20 nm to about 100 nm in some embodiments.

In FIGS. 13A and 13B, the pad oxide layer 24 and the SiN layer 25 are removed. By this operation, the isolation insulating layer 30 is also partially etched, and the dielectric separation wall 50 is partially exposed. At this stage of the manufacturing process, the protruding height H15 of the separation wall 50 (50H) from the upper surface of the isolation insulating layer 30 is in a range from about 5 nm to about 20 nm in some embodiments. The difference in height between the separation wall 50H and the fins F1 or F3 is in a range from about 10 nm to about 40 nm in some embodiments. The difference H17 in height between the fin F2 and fins F1 or F3 is in a range from about 100 nm to about 300 nm in some embodiments. The height H18 of the high portions 50H is in a range from about 150 nm to about 400 nm and the height H19 of the low portion 50L is in a range from about 100 nm to about 300 nm in some embodiments.

In FIGS. 15A and 15B, the isolation insulating layer 30 is further recessed so that upper portions of the first, third and fourth fins F1, F3 and F4 and the dielectric separation wall 50 are exposed. Here, the recessed second fin F2 is not exposed and still embedded in the isolation insulating layer 30. The first, third and fourth fins F1, F3 and F4 are exposed in an amount H2O of about 50 nm to about 200 nm in some embodiments.

In FIGS. 16A and 16B, a dummy gate dielectric layer 65 is formed on the exposed fins and dielectric separation wall 50. The dummy gate dielectric layer 65 is made of, for example, silicon oxide, with a thickness of 0.5 nm to 2 nm in some embodiments, and may be formed by CVD and/or ALD. The dummy gate dielectric layer 65 is also formed on the upper surface of the isolation insulating layer 30.

In FIGS. 17A and 17B, a dummy gate electrode layer is formed and the dummy gate electrode layer is patterned by using a hard mask including layers 72 and 74, thereby forming dummy gate electrodes 70. At least one dummy gate electrode 70 is disposed over the first and third fins and the low portion 50L of the dielectric separation wall 50, and at least one dummy gate electrode 70 is disposed over the first and third fins and the high portion 50H of the dielectric separation wall 50. In some embodiments, the mask layer 72 is made of a silicon nitride based material, such as SiN, and the mask layer 74 is made of a silicon oxide based material, such as $SiO_2$.

Figure 18A:
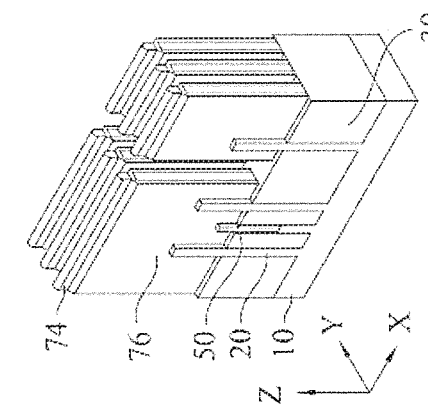
FIG. 18A is a perspective view and FIG. 18B is a cross sectional view corresponding to line X1-X1 of FIG. 1B, both of which illustrate one of various stages of a sequential semiconductor device manufacturing process according to some embodiments of the present disclosure.
Figure 18B:
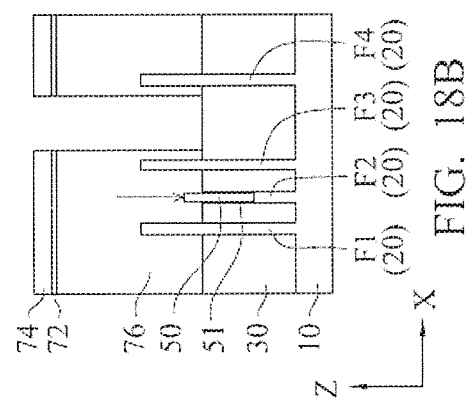

In FIGS. 18A and 18B, sidewall spacers 76 are formed on opposing sides of the dummy gate electrodes 70. A blanket layer of silicon nitride based material (e.g., SiN, SiON or SiCN) is formed and then anisotropic etching is performed. By this etching, the dummy gate dielectric layer 65 formed on the exposed fins is removed. Further, exposed dielectric separation wall 50 is recessed in some embodiments. In such a case, the structure as shown in FIG. 1E can be obtained. In other embodiments, the dielectric separation wall 50 is not recessed. In such a case, the structure as shown in FIG. 1F can be obtained.

Figure 19A:
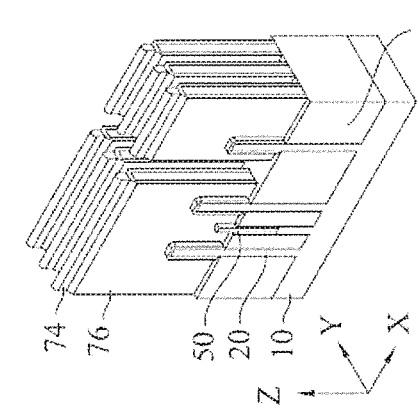
FIG. 19A is a perspective view and FIG. 19B is a cross sectional view corresponding to line X1-X1 of FIG. 1B, both of which illustrate one of various stages of a sequential semiconductor device manufacturing process according to some embodiments of the present disclosure.
Figure 19B:
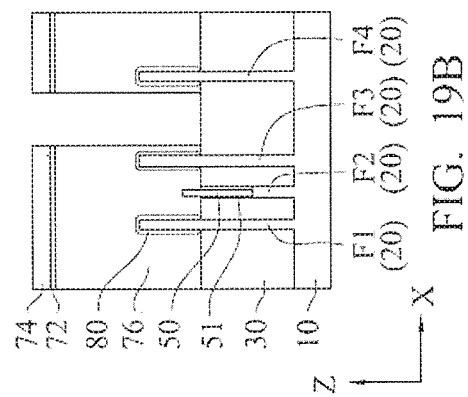

In FIGS. 19A and 19B, a source/drain (S/D) epitaxial layer 80 is formed on the exposed fins. The epitaxial S/D layer 80 is epitaxially formed on the exposed fins and includes one or more crystalline layers of SiP, SiC, SiCP, SiB, SiGe and Ge. In some embodiments, a silicide layer is further formed over the epitaxial S/D layer 80.

Subsequently, an etch-stop layer (ESL) 82 is formed and an interlayer dielectric (ILD) layer 84 is formed in spaces between the dummy gate electrodes 70 with sidewall spacers 76 and over the S/D regions. The ILD layer 84 may include silicon oxide, silicon nitride, silicon oxynitride (SiON), SiOCN, fluorine-doped silicate glass (FSG), or a low-k dielectric material, and may be made of CVD or other suitable process. The insulating material for the dielectric separation wall 50 is different from that for the isolation insulating layer 30 and the ILD layer 84.

Figure 20A:
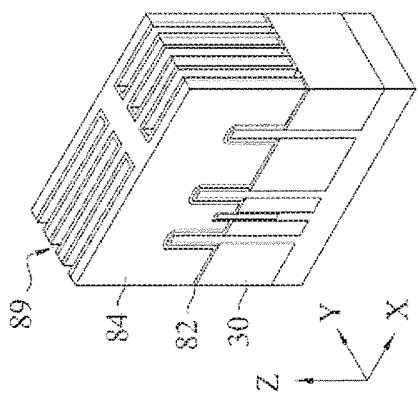
FIG. 20A is a perspective view and FIG. 20B is a cross sectional view corresponding to line X1-X1 of FIG. 1B, both of which illustrate one of various stages of a sequential semiconductor device manufacturing process according to some embodiments of the present disclosure.
Figure 20B:
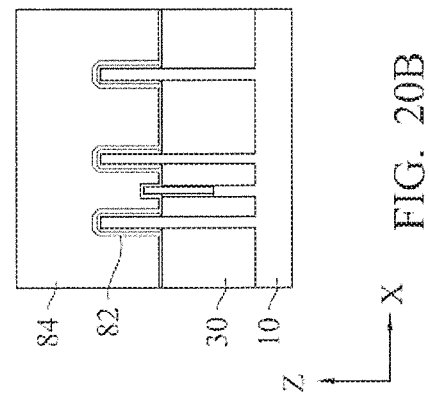

Planarization operations, such as an etch-back process and/or a chemical mechanical polishing (CMP) process, are performed, so that upper portions of the dummy gate electrodes 70 and the dielectric separation wall 50 are exposed. Then, the dummy gate electrode 70 and the dummy gate dielectric layer 65 are removed, thereby forming gate spaces 89, as shown in FIGS. 20A and 20B.

In FIGS. 21A-21C, metal gate structures 90 including a gate dielectric layer 92 and a metal gate electrode layer 96 are formed in the gate spaces 89. In certain embodiments, the gate dielectric layer 92 includes one or more layers of dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The metal gate electrode layer 96 includes any suitable material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments, one or more work function adjustment layers 94 are also disposed between the gate dielectric layer 92 and the metal gate electrode layer 96. The work function adjustment layers are made of a conductive material such as a single layer of TiN, TaN, TaAlC, TiC, TaC, Co, Al, TiAl, Hifi, TiSi, TaSi or TiAlC, or a multilayer of two or more of these materials. For the n-channel FET, one or more of TaN, TaAlC, TiN, TiC, Co, TiAl, Hifi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

In forming the metal gate structures, the gate dielectric layer, the work function adjustment layer and the gate electrode layer are formed by suitable film forming method, for example, CVD or ALD for gate dielectric layer, and CVD, PVD, ALD or electroplating for the metal layers, and then a planarization operation such as CMP is performed to remove excess material formed over the ILD layer 84.

In FIGS. 22A-22C, the ILD layer 84 and the metal gate structures 90 are further recessed by a planarization operation such as CMP, thereby exposing the high portions 50H of the separation wall 50.

In other embodiments, during the operations of FIGS. 20A and 20B, the dielectric separation wall 50 is exposed to divide the dummy gate structure into two sub-dummy gate structures, and during the operations of FIGS. 21A-22C, the two sub-dummy gate structures are replaced with a metal gate structure, respectively.

As set forth above, the separation wall 50 is formed before the dummy gate structure and the metal gate structure are formed. Accordingly, it is possible to minimize the width of the separation wall 50 and to enlarge the end size of the metal gate electrode and the fin structure.

It is understood that the structure undergoes further CMOS processes to form various features such as interconnect vias, interconnect metal layers, passivation layers, etc.

FIGS. 23A-23D show various views of a semiconductor fin field effect transistor (FinFET) according to other embodiments of the present disclosure. Materials, configurations, processes and/or structures same as or similar to those of FIGS. 1A-22C may be applied to the following embodiments, and detailed explanation may be omitted.

In the following embodiments, a distance between a dielectric separation wall 150 and a fin 120 is substantially varies. The distance may be defined by dummy layers' thicknesses. The dielectric separation wall 150 is located on the isolation insulating layer 130. The gate dielectric layer 192 (interfacial silicon oxide and high-k dielectric material) is deposited on the fin 120 and the dielectric separation wall 150.

As shown in FIGS. 23A-23D, a semiconductor device includes a substrate 110, semiconductor fins 120 and gate structures 190. The bottom of the semiconductor fins 120 are embedded in an isolation insulating layer 130, which is also called shallow trench isolation (STI). In FIGS. 23A-23D, four fins F11, F12, F13 and F14 are disposed over the substrate 110, but the number of the fins is not limited to four. Some of the gate structures 190 are physically separated by separation walls 150A or 150B made of a dielectric material. On opposing sides of the gate structure 190, sidewall spacers 176 are disposed. The gate structures 190 include a gate dielectric layer 192, a work function adjustment layer 194 and a body gate electrode 196.

The fins 120 not covered by the gate structures 190 are source/drain (S/D) regions. An epitaxial layer 180 is formed on the S/D regions of the fins 120 and an etch stop layer (ESL) 182 is formed over the epitaxial layer 180. Further, an interlayer dielectric (ILD) layer 184 is formed to cover the S/D structures.

In 23A-23D, the fin structures 120 includes first F11, second F12, third F13 and fourth F14 fin structures disposed in this order, in some embodiments. A pitch P31 between the first fin F11 and second fin F12 is 2FP, a pitch P32 of the second fin F12 and the third fin F13 is 3FP and a pitch P33 between the third fin F13 and the fourth fin F14 is 4FP or more. In some embodiments, where FP is a base fin pitch (minimum fin pitch defined by a design rule) FP, which is about 14 nm to 30 nm in some embodiments.

Figure 23A:
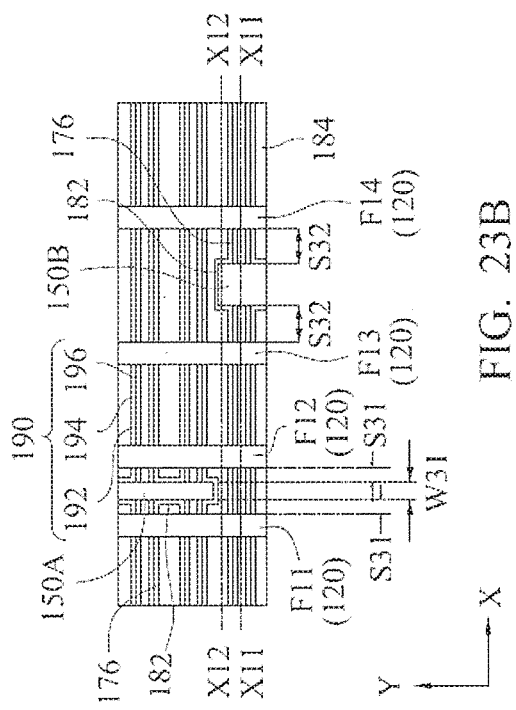
FIG. 23A shows a perspective view of a semiconductor device according to some embodiments of the present disclosure.
Figure 23C:
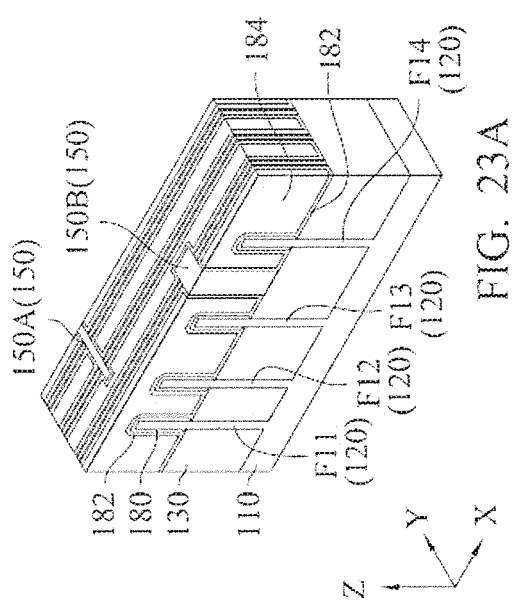
FIG. 23C shows a cross sectional view corresponding to line X11-X11 of FIG. 23B.
Figure 23B:
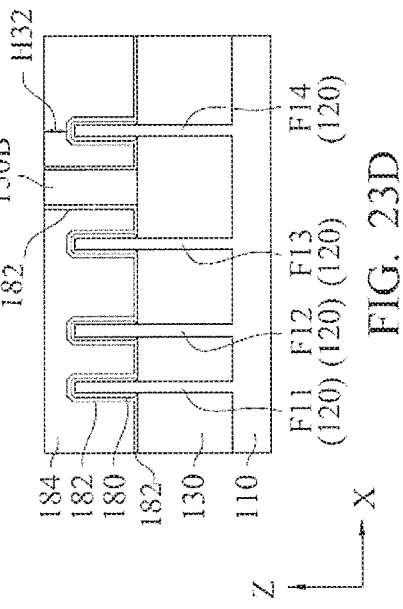
FIG. 23B shows a plan view of a semiconductor device according to some embodiments of the present disclosure.
Figure 23D:
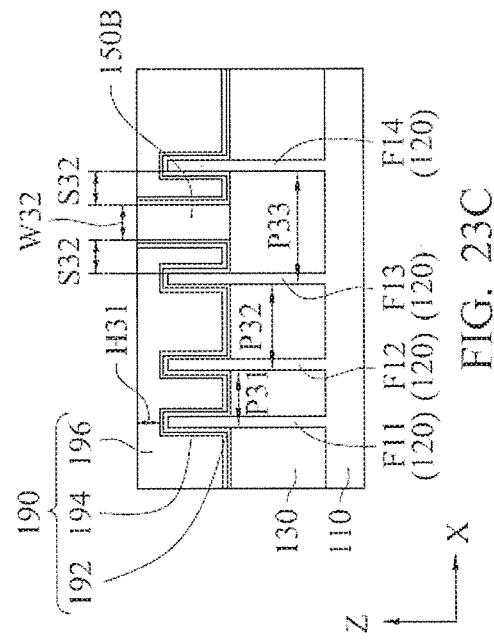
FIG. 23D shows a cross sectional view corresponding to line X12-X12 of FIG. 23B according to some embodiments of the present disclosure.

As shown in FIGS. 23C and 23D, the distance H32 between the ESL 182 on the S/D region and the upper surface of the ILD layer 184 is in a range from about 14 nm to about 30 nm in some embodiments. The distance H31 between the top of the fin F11 and the upper surface of the body gate electrode 96 is in a range from about 18 nm to about 40 nm in some embodiments.

In 23A-23D, a distance S31 between the dielectric separation wall 150A and the adjacent fin F11 or F12 is in a range from about 8 nm to about 20 nm, and a distance S32 between the dielectric separation wall 150B and the adjacent fin F13 or F14 is in a range from about 20 nm to about 40 nm, in some embodiments.

The width W31 of the dielectric separation wall 150A is about 4 nm to about 8 nm in some embodiments. The width W32 of the dielectric separation wall 150B is about 8 nm to about 40 nm in some embodiments.

As shown in FIGS. 23C and 2D, the bottom of the dielectric separation wall 150 is on the upper surface of the isolation insulating layer 130.

The materials of the dielectric separation wall can be SiCN, SiOCN and metal oxide, such as $HfO_2$, $ZrO_2$ and $Al_2O_3$, or any suitable dielectric material.

FIGS. 24A-45B show various stages of a sequential semiconductor device manufacturing process according to other embodiments of the present disclosure. In FIGS. 24A-45B, the "A" figures illustrate a perspective view, the "B" figures illustrate a cross-sectional view along the X direction corresponding to line X12-X12 of FIG. 23B, and the "C" figures illustrate a plan view. It is understood that additional operations can be provided before, during, and after processes shown by FIGS. 24A-45B, and some of the operations described below can be replaced or eliminated, for additional embodiments of the method. The order of the operations/processes may be interchangeable. Structures, configurations, materials and/or processes similar to or same as the foregoing embodiments may be employed in the following embodiments, and the detailed explanations may be omitted.

Figure 24A:
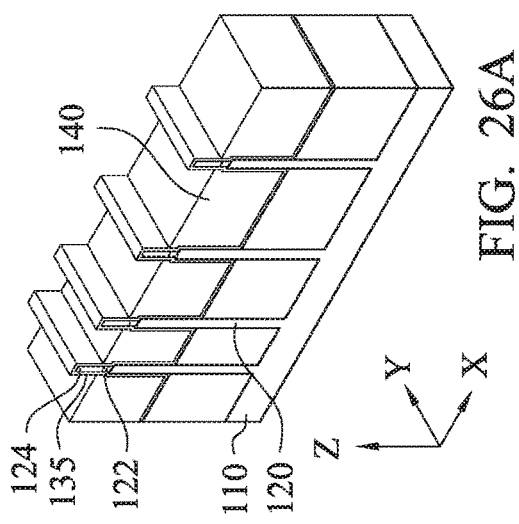
FIG. 24A is a perspective view and FIG. 24B is a cross sectional view corresponding to line X12-X12 of FIG. 23B, both of which illustrate one of various stages of a sequential semiconductor device manufacturing process according to some embodiments of the present disclosure.
Figure 24B:
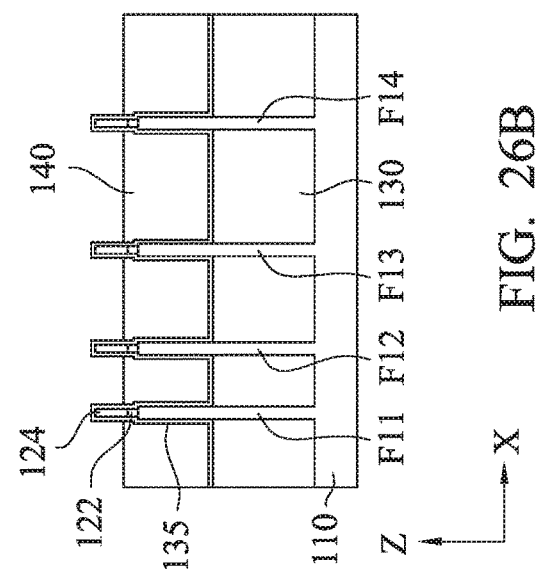

In FIGS. 24A and 24B, the fin structures 120 are formed over a substrate 110. The fins F11-F14 include a first cap layer 122 and a second cap layer 124. The first cap layer 122 is made of metal oxide such as titanium oxide, hafnium oxide and zirconium oxide. The thickness of the first cap layer 122 is about 5 nm to about 20 nm in some embodiments. The second cap layer 124 is made of amorphous or poly material of Group IV material, such as amorphous or poly silicon, silicon germanium or germanium. In some embodiments, the second cap layer 124 is made of amorphous Si with a thickness of about 20 nm to about 50 nm.

Further, an insulating isolation layer (STI) 130 is formed. An insulating material layer for the isolation insulating layer 130 is formed over the substrate 110 so as to fully cover the fin structures 120. A planarization operation, such as a chemical mechanical polishing (CMP) method, is performed, thereby exposing the second cap layer 124.

Figure 25A:
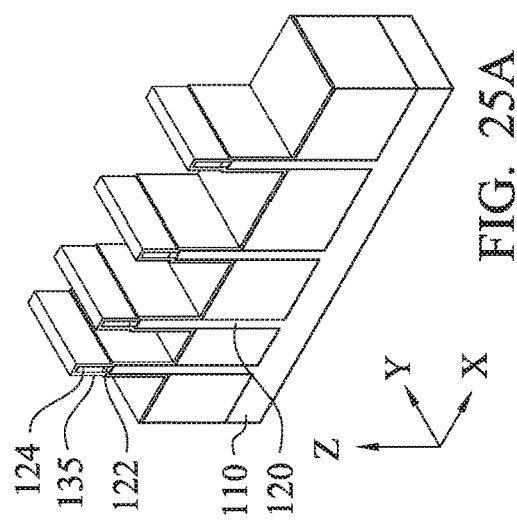
FIG. 25A is a perspective view and FIG. 25B is a cross sectional view corresponding to line X12-X12 of FIG. 23B, both of which illustrate one of various stages of a sequential semiconductor device manufacturing process according to some embodiments of the present disclosure.
Figure 25B:
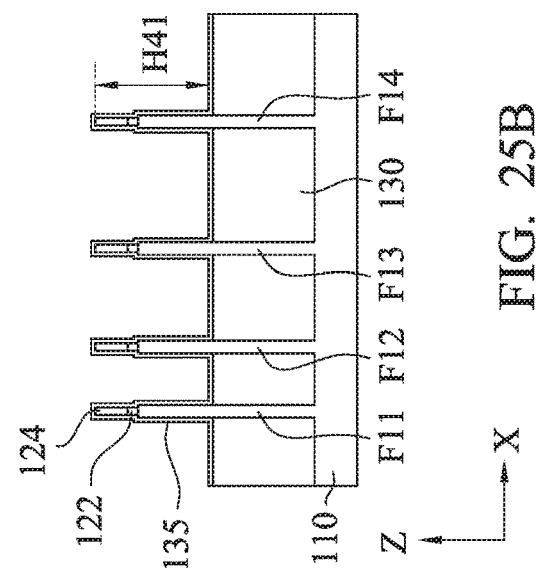

In FIGS. 25A and 25B, the isolation insulating layer 130 is recessed, and an oxide layer 135 is formed. The oxide layer 135 may be formed by ALD and/or CVD and has a thickness about 1 nm to about 5 nm in some embodiments. After the isolation insulating layer 130 is recessed the distance between the upper surface of the isolation insulating layer 130 and the top of the second cap layer 124 is in a range from about 100 nm to about 400 nm in some embodiments.

Figure 26A:
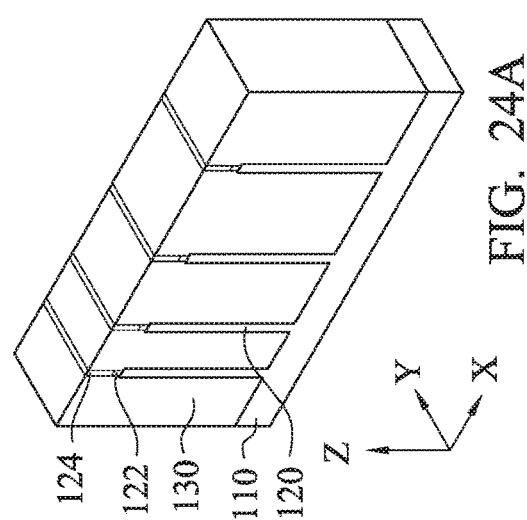
FIG. 26A is a perspective view and FIG. 26B is a cross sectional view corresponding to line X12-X12 of FIG. 23B, both of which illustrate one of various stages of a sequential semiconductor device manufacturing process according to some embodiments of the present disclosure.
Figure 26B:
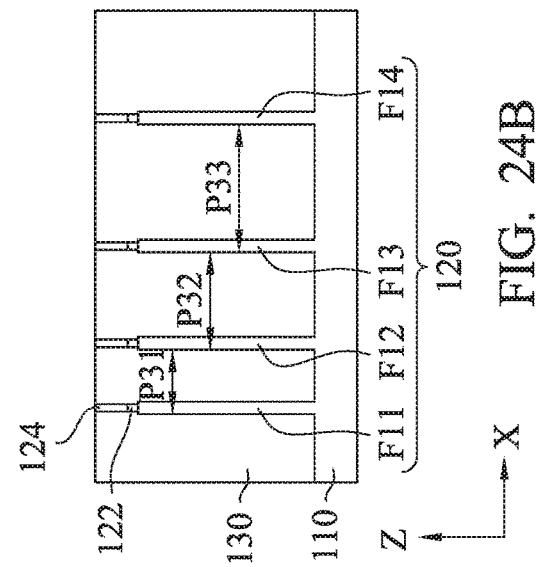

In FIGS. 26A and 26B, a sacrificial layer 140 is formed over the recessed isolation insulating layer 130 such that the second cap layer 124 covered with the oxide layer 135 protrudes from the isolation insulating layer 130. In some embodiments, the sacrificial layer 140 is made of an organic material, such as bottom anti reflective coating (BARC) or photo resist. A thick layer is first formed, and then an etch-back operation is performed to adjust the thickness of the sacrificial layer 140.

In FIGS. 27A and 27B, the oxide layer 135 formed on the second cap layer 124 is removed by wet and/or dry etching, and then the sacrificial layer 140 is removed.

In FIGS. 28A and 28B, a first dummy layer 142 is formed over the fins. The first dummy layer 142 is made of amorphous or poly material of a Group IV material, such as amorphous or poly silicon, silicon germanium or germanium. In some embodiments, the first dummy layer 142 is made of amorphous Si with a thickness of about 5 nm to about 20 nm. Here, spaces are formed between the first dummy layers formed on the adjacent fin structures. A blanket layer of amorphous Si is formed and then anisotropic etching is performed. The space S41 between the first dummy layers formed on the first fin F11 and the second fin F12 is in a range from about 4 nm to about 14 nm in some embodiments. The height H42 between the upper surface of the isolation insulating layer 130 and the top of the first dummy layer 142 is in a range from about 120 nm to about 500 nm in some embodiments. In some embodiments, since the second cap layer 124 and the first dummy layer 142 are made of the same material, e.g., amorphous Si, there is no observable boundary between the second cap layer 124 and the first dummy layer 142.

In FIGS. 29A and 29B, a second dummy layer 143 is conformally formed, by using ALD or CVD. The second dummy layer 143 is made of silicon nitride based material, such as SiN and SiON. In some embodiments, the second dummy layer 143 is made of SiN with a thickness of about 5 nm to about 20 nm. The second dummy layer 143 fully fills the space between the first and second fins, while spaces are formed between the second and third fins and between the third and fourth fins.

Figure 30A:
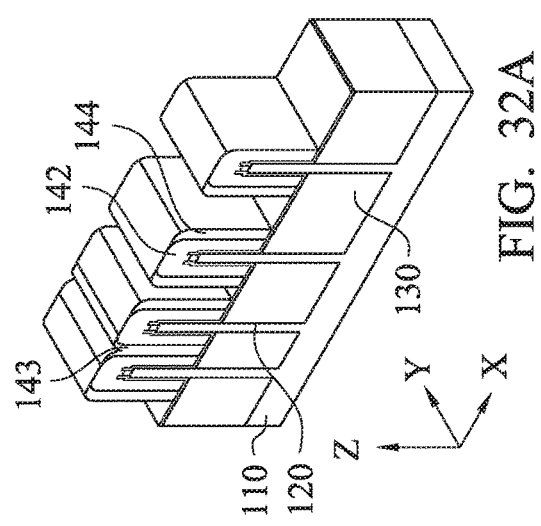
FIG. 30A is a perspective view and FIG. 30B is a cross sectional view corresponding to line X12-X12 of FIG. 23B, both of which illustrate one of various stages of a sequential semiconductor device manufacturing process according to some embodiments of the present disclosure.
Figure 30B:
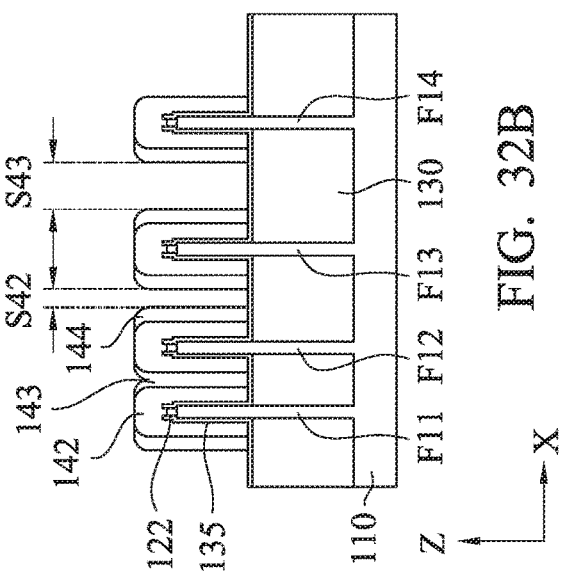

In FIGS. 30A and 30B, anisotropic etching is performed to remove unnecessary portion of the second dummy layer 143, while the second dummy layer 143 in the space between the first and second fins remains.

Figure 31A:
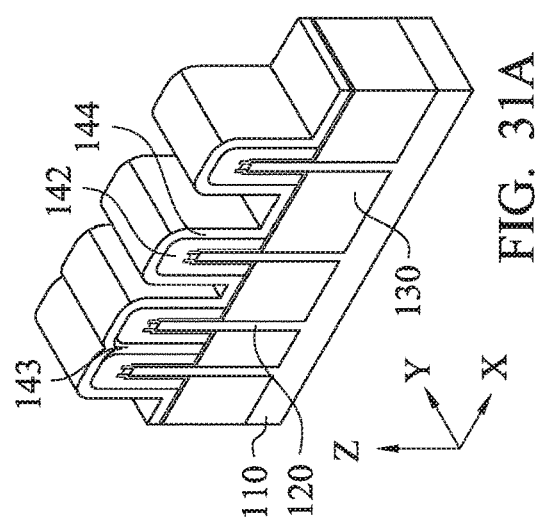
FIG. 31A is a perspective view and FIG. 31B is a cross sectional view corresponding to line X12-X12 of FIG. 23B, both of which illustrate one of various stages of a sequential semiconductor device manufacturing process according to some embodiments of the present disclosure.
Figure 31B:
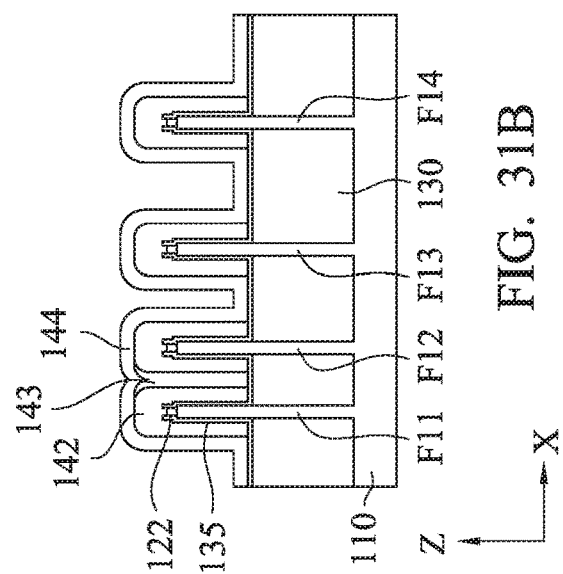

In FIGS. 31A and 31B, a third dummy layer 144 is formed. The third dummy layer 144 is made of amorphous or poly material of a Group IV material, such as amorphous or poly silicon, silicon germanium or germanium. In some embodiments, the third dummy layer 144 is made of amorphous Si with a thickness of about 5 nm to about 20 nm. Here, spaces are formed between the third dummy layers formed on the adjacent fins.

Figure 32A:
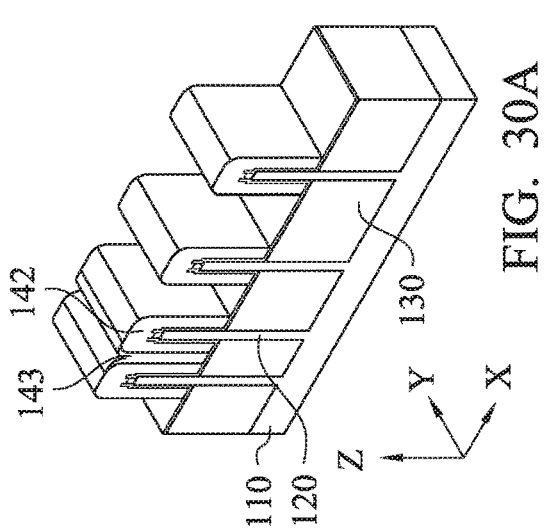
FIG. 32A is a perspective view and FIG. 32B is a cross sectional view corresponding to line X12-X12 of FIG. 23B, both of which illustrate one of various stages of a sequential semiconductor device manufacturing process according to some embodiments of the present disclosure.
Figure 32B:
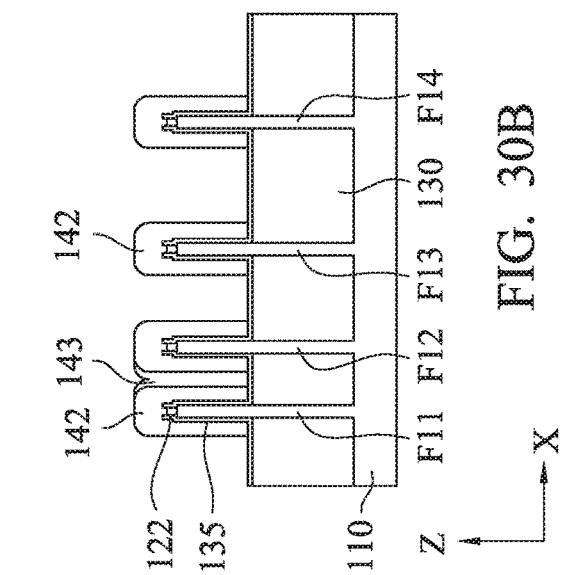

In FIGS. 32A and 32B, anisotropic etching is performed. The space S42 between the third dummy layers formed on the second fin F12 and the third fin F13 is in a range from about 4 nm to about 14 nm in some embodiments. The space S43 between the third dummy layers formed on the third fin F13 and the fourth fin F14 is in a range from about 8 nm to about 40 nm in some embodiments.

Figure 33A:
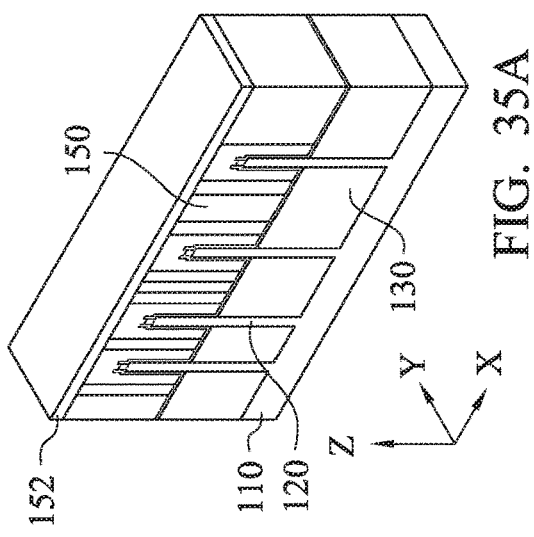
FIG. 33A is a perspective view and FIG. 33B is a cross sectional view corresponding to line X12-X12 of FIG. 23B, both of which illustrate one of various stages of a sequential semiconductor device manufacturing process according to some embodiments of the present disclosure.
Figure 33B:
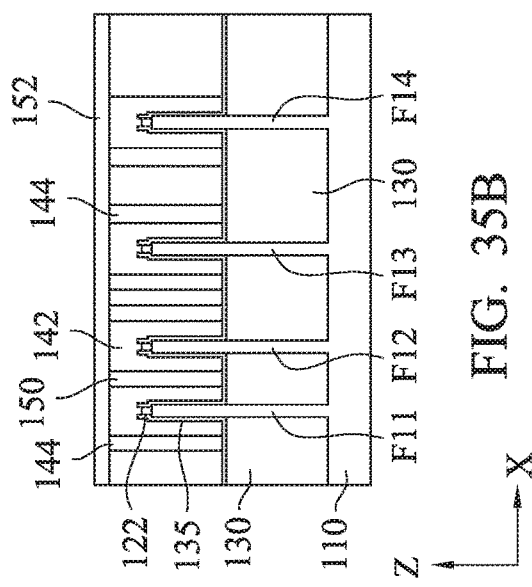

In FIGS. 33A and 33B, the second dummy layer 143 is removed by wet and/or dry etching. The space S44 between the third dummy layers formed on the second fin F12 and the third fin F13 is in a range from about 4 nm to about 14 nm in some embodiments. The space S45 between the third dummy layers formed on the third fin F13 and the fourth fin F14 is in a range from about 8 nm to about 40 nm in some embodiments.

Figure 34A:
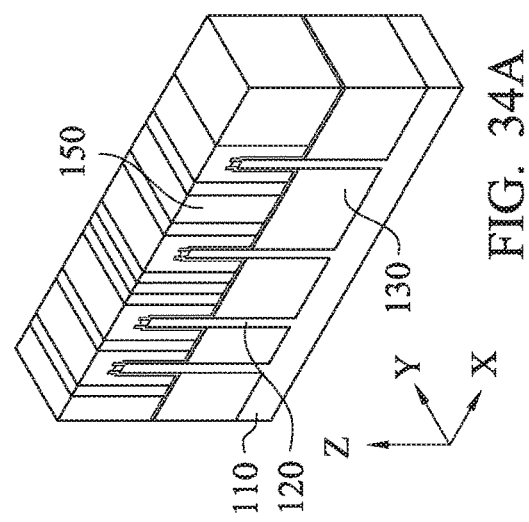
FIG. 34A is a perspective view and FIG. 34B is a cross sectional view corresponding to line X12-X12 of FIG. 23B, both of which illustrate one of various stages of a sequential semiconductor device manufacturing process according to some embodiments of the present disclosure.
Figure 34B:
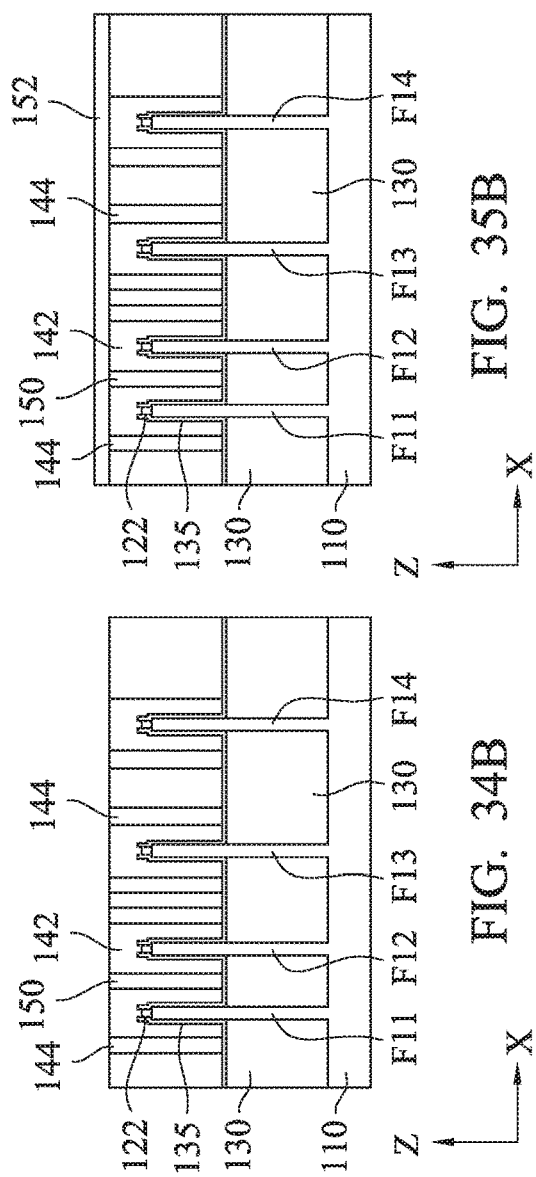

In FIGS. 34A and 34B, a dielectric material for the dielectric separation wall 150 is formed. A blanket layer of the dielectric material is formed and then CMP or etch back operations are performed. The dielectric separation wall 150 includes one or more layers of Si SiCN, SiOCN, metal oxide, such as $HfO_2$, $ZrO_2$ and $Al_2O_3$, or any other suitable dielectric material. The dielectric material for the dielectric separation wall 150 may be formed by chemical vapor deposition (CVD), atomic layer deposition (ALD) or any other suitable film formation methods.

Figure 35A:
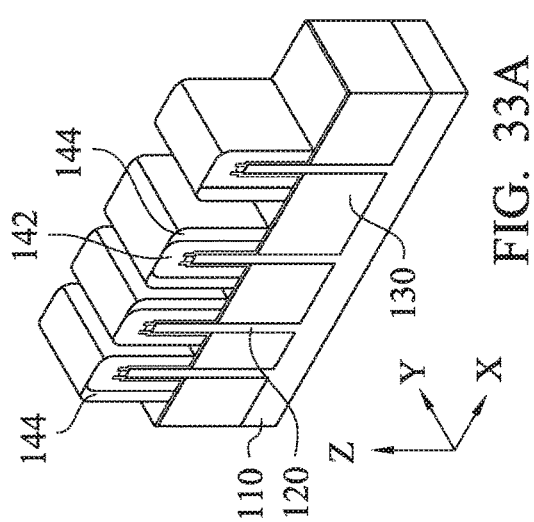
FIG. 35A is a perspective view and FIG. 35B is a cross sectional view corresponding to line X12-X12 of FIG. 23B, both of which illustrate one of various stages of a sequential semiconductor device manufacturing process according to some embodiments of the present disclosure.
Figure 35B:
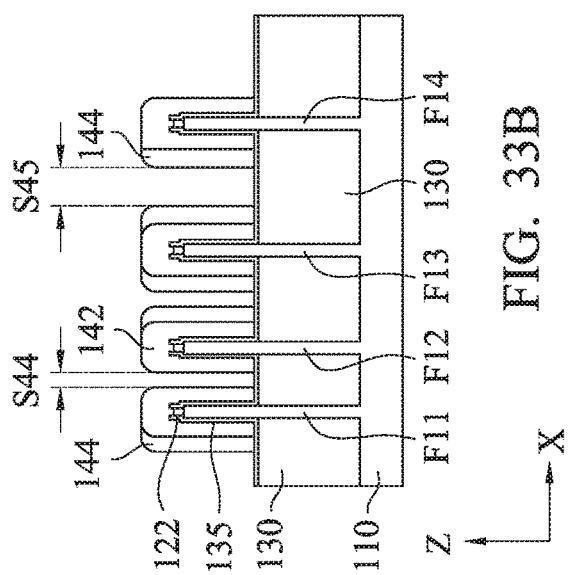

In FIGS. 35A and 35B, a mask layer 152 is formed on the dielectric material for the dielectric separation wall 150 and the first and third dummy layers 142 and 144. The mask layer 152 includes one or more layers of silicon oxide based material, such as $SiO_2$ and SiON. In some embodiments, the mask layer 152 is $SiO_2$ with a thickness of about 5 nm to about 30 nm.

Figure 36A:
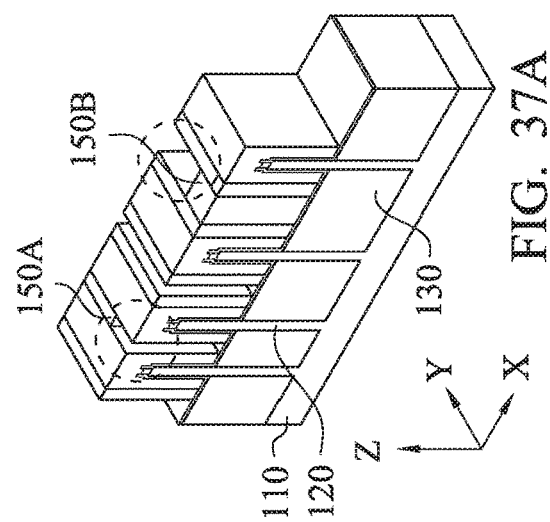
FIG. 36A is a perspective view.
Figure 36C:
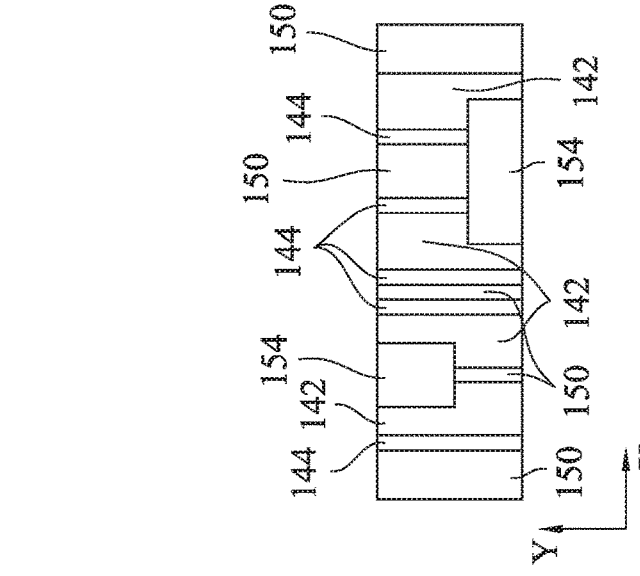
FIG. 36C is a plan view, all of which illustrate one of various stages of a sequential semiconductor device manufacturing process according to some embodiments of the present disclosure.
Figure 36B:
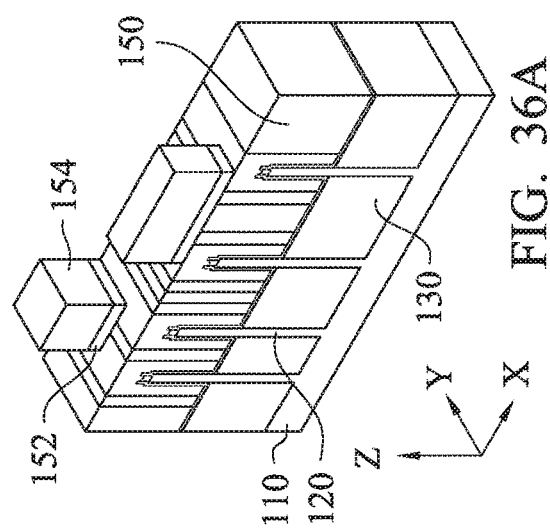
FIG. 36B is a cross sectional view corresponding to line X12-X12 of FIG. 23B

In FIGS. 36A-36C, by using a photo resist pattern 154, the mask layer 152 is patterned. One of the photo resist patterns is located over a region where two sets of gate electrodes are separately formed, and one of the photo resist patterns is located over a region where another set of gate electrodes are separately formed. See, FIG. 23B.

Figure 37A:
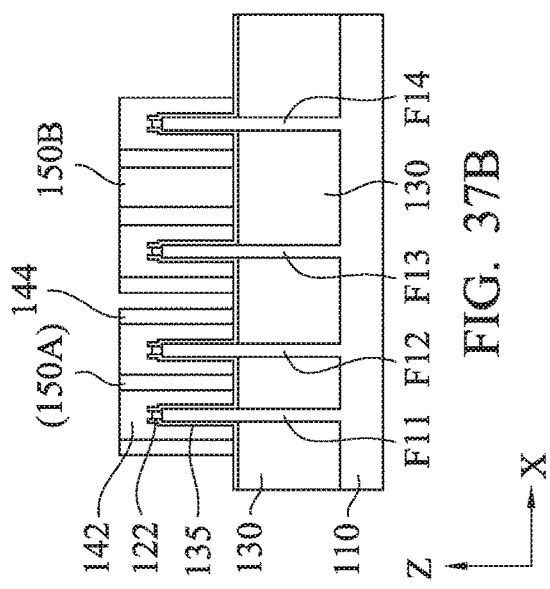
FIG. 37A is a perspective view and FIG. 37B is a cross sectional view corresponding to line X12-X12 of FIG. 23B, both of which illustrate one of various stages of a sequential semiconductor device manufacturing process according to some embodiments of the present disclosure.
Figure 37B:
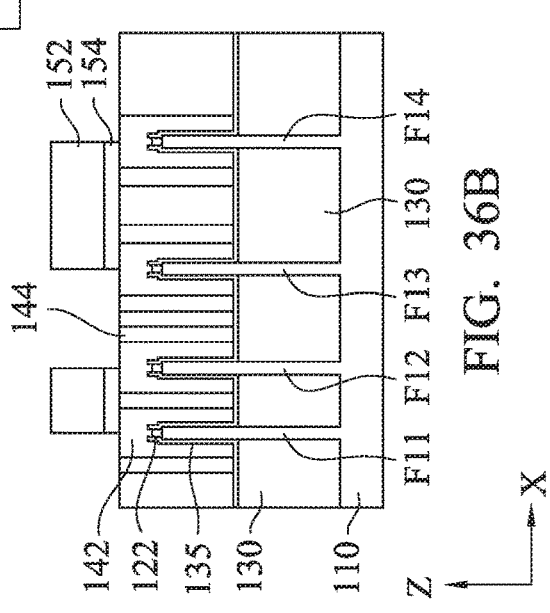

In FIGS. 37A and 37B, by using the patterned mask layer 152 as an etching mask, the dielectric material for the dielectric separation wall 150 is patterned, thereby forming a first dielectric separation wall 150A and a second dielectric separation wall 150B. The first dielectric separation wall 150A has a different width than the second dielectric separation wall 150B. In some embodiments, the width of first dielectric separation wall 150A is twice or more the width of the second dielectric separation wall 150B.

In FIGS. 38A and 38B, a fourth dummy layer 170 is formed. The fourth dummy layer 170 is made of amorphous or poly material of a Group IV material, such as, amorphous or poly silicon, silicon germanium or germanium. In some embodiments, the fourth dummy layer 170 is made of poly Si. In certain embodiments, since the second cap layer 124, the first dummy layer 142, the third dummy layer 144 and the fourth dummy layer 170 are made of the same material, e.g., amorphous Si, they are treated as one dummy gate electrode layer.

In FIGS. 39A-39D, the dummy gate electrode layer (layers 124, 142, 144 and 170) is patterned by using a hard mask including layers 172 and 174, thereby forming dummy gate electrodes 175. At least one dummy gate electrode 175 is disposed over the first and second fins and the first dielectric separation wall 150A, and at least one dummy gate electrode 175 is disposed over the third and fourth fins and the second dielectric separation wall 150B. In some embodiments, as shown in FIG. 39C, two dummy gate electrodes 175 are disposed over the first to fourth fins and the first dielectric separation wall 150A, and one dummy gate electrode 175 is disposed over the first to fourth fins and the second dielectric separation wall 150B. The width W41 of the dummy gate electrode 175 is in a range from about 4 nm to about 20 nm in some embodiments.

In FIGS. 40A and 40B, sidewall spacers 176 are formed on opposing sides of the dummy gate electrodes 175. A blanket layer of silicon nitride based material (SiN, SiON, SiCN) is formed and then anisotropic etching is performed. By this etching, the silicon nitride based material formed on the exposed fins is removed. In some embodiments, the dielectric separation walls 150 not covered by the dummy gate electrode and the sidewall spacers are recessed. In other embodiments, the dielectric separation walls 150 are not recessed.

In FIGS. 41A and 41B, a source/drain (S/D) epitaxial layer 180 is formed on the exposed fins. The epitaxial S/D layer 180 includes one or more crystalline layers of SiP, SiC, SiCP, SiB, SiGe and Ge. In some embodiments, a silicide layer is further formed over the epitaxial S/D layer 180.

In FIGS. 42A and 42B, an etch-stop layer (ESL) 182 is formed and an interlayer dielectric (ILD) layer 184 is formed in spaces between the dummy gate electrodes 175 with sidewall spacers 176. The ILD layer 184 may include silicon oxide, silicon nitride, silicon oxynitride (SiON), SiOCN, fluorine-doped silicate glass (FSG), or a low-K dielectric material, and may be made of CVD or other suitable process. The insulating material for the dielectric separation wall 150 is different from the isolation insulating layer 130 and the ILD layer 184.

Planarization operations, such as an etch-back process and/or a chemical mechanical polishing (CMP) process, are performed, so that upper portions of the dummy gate electrodes 175 and the first and second dielectric separation walls 150A and 150B are exposed.

In FIGS. 43A and 43B, the dummy gate electrode 175, first and second cap layers 122, 124 and the oxide layer 135 are removed, thereby forming gate spaces 189.

In FIGS. 44A-44C, metal gate structures 190 including a gate dielectric layer 192, a work function adjustment layer 194 and a metal gate electrode layer 96 are formed in the gate space 189. In forming the metal gate structures, the gate dielectric layer, the work function adjustment layer and the gate electrode layer are formed by a suitable film forming method, for example, CVD or ALD for gate dielectric layer, and CVD, PVD, ALD or electroplating for the metal layers, and then a planarization operation such as CMP is performed to remove excess material formed over the ILD layer 184.

In FIGS. 45A and 45B, a planarization operation, such as CMP, is performed to expose the dielectric separation walls 150A and 150B.

In some embodiments, one gate electrode 190 and at least one of the sidewall spaces 176 are separated by the first dielectric separation wall 150A from another second gate electrode 190 and at least one of the sidewall spacers 176. Further, in some embodiments, the sidewall spacers 176 are continuously formed on sidewalls of the first dielectric separation wall 150A, and other sidewall spacers 176 are continuously formed on other sidewalls of the first dielectric separation wall 150A.

In other embodiments, during the operations of FIGS. 42A and 42B, the dielectric separation wall 150 is exposed to divide the dummy gate structure into two sub-dummy gate structures, and during the operations of FIGS. 43A-45B, the two sub-dummy gate structures are replaced with a metal gate structure, respectively.

As set forth above, the separation wall 150 is formed before the dummy gate structure and the metal gate structure are formed. Accordingly, it is possible to more precisely control the width of the separation wall 150 and to enlarge the end size of the metal gate electrode and the fin structure.

It is understood that the structure undergoes further CMOS processes to form various features such as interconnect vias, interconnect metal layers, passivation layers, etc.

The various embodiments or examples described herein offer several advantages over the existing art. By using the dielectric separation wall as described above, it is possible to secure an appropriate amount (dimension) of an end cap (a space between the dielectric separation wall and the closest fin), and to reduce a fin-to-fin space.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, a separation wall made of a dielectric material is formed between two fin structures. A dummy gate structure is formed over the separation wall and the two fin structures. An interlayer dielectric (ILD) layer is formed over the dummy gate structure. An upper portion of the ILD layer is removed, thereby exposing the dummy gate structure. The dummy gate structure is replaced with a metal gate structure. A planarization operation is performed to expose the separation wall, thereby dividing the metal gate structure into a first gate structure and a second gate structure. The first gate structure and the second gate structure are separated by the separation wall.

An upper portion of the ILD layer is removed, thereby exposing the separation wall and dividing the dummy gate structure into a first dummy gate structure and a second dummy gate structure. The first dummy gate structure and the second dummy gate structure are replaced with a first gate structure and a second gate structure, respectively. The first gate structure and the second gate structure are separated by the separation wall.

According to another aspect of the present disclosure, in a method of manufacturing a semiconductor device, first, second and third fin structures are formed. The second fin structure is located between the first and third fin structures, and each of the first to third fin structures is made of semiconductor material and having an insulating cap layer. An isolation insulating layer is formed such that the first to third fin structures are embedded in the isolation insulating layer and the insulating cap layer is exposed. A first mask pattern is formed over the isolation insulating layer. The first mask pattern has a first opening over the second fin structure. The second fin structure is recessed by etching using the first mask pattern as an etching mask. A dielectric separation wall is formed on the recessed second fin structure. The isolation insulating layer is formed so that upper portions of the first and third fin structures and an upper portion of the dielectric separation wall are exposed. A first dummy gate structure is formed over the exposed first and third fin structures and the exposed dielectric separation wall. An interlayer dielectric (ILD) layer is formed over the first dummy gate structure. An upper portion of the ILD layer is removed, thereby exposing the first dummy gate structure. The first gate structure is replaced with a metal gate structure. A planarization operation is performed, thereby dividing the metal gate structure into a first gate structure and a second gate structure. The first gate structure and the second gate structure are separated by the dielectric separation wall.

According to another aspect of the present disclosure, a semiconductor device includes a first gate electrode disposed over an isolation insulating layer formed on a substrate, a second gate electrode disposed over the isolation insulating layer, the first and second gate electrodes extending in and being aligned along a first direction, and a dielectric separation wall protruding from the isolation insulating layer and disposed between and separating the first gate electrode and the second gate electrode. The dielectric separation wall is made of a different dielectric material than the isolation insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming first and second fin structures made of semiconductor and having a cap layer, the first and second fin structures protruding from an isolation insulating layer;
    forming a first dummy layer over the first and second fin structures such that a space is formed between the first dummy layer formed on the first fin structure and the first dummy layer formed on the second fin structure;
    forming a dielectric separation wall in the space;
    forming a second dummy layer over the first dummy layer and the dielectric separation wall;
    patterning the first and second dummy layers, thereby forming a dummy gate structure;
    forming an interlayer dielectric layer (ILD) over the dummy gate structure;
    removing an upper portion of the ILD layer, thereby exposing the dielectric separation wall and first and second fin structures, and dividing the first dummy gate structure into a first sub-dummy gate structure and a second sub-dummy gate structure; and
    replacing the first sub-dummy gate structure and the second sub-dummy gate structure with a first gate structure and a second gate structure, respectively,
    wherein the first gate structure and the second gate structure are separated by the dielectric separation wall.

2. The method of claim 1, wherein the dielectric separation wall includes one or more layers of SiCN, zirconium oxide, aluminum oxide and hafnium oxide.

3. The method of claim 1, wherein the cap layer includes one or more layers of titanium oxide, hafnium oxide and zirconium oxide and an amorphous silicon layer formed thereon.

4. The method of claim 1, wherein the first and second dummy layers are made of a same material.

5. The method of claim 4, wherein the first and second dummy layers are made of amorphous or polycrystalline material of a Group IV material.

6. The method of claim 1, further comprising before forming the first dummy layer over the first and second fin structures, forming an insulating layer over the first and second fin structures.

7. The method of claim 1, wherein a thickness of the first dummy layer on one side face of the first fin structure facing the second fin structure is smaller than a thickness of the first dummy layer on another side of the fin structure opposite to the one side.

8. A method of manufacturing a semiconductor device, the method comprising:
    forming first, second, third and fourth fin structures, which are disposed in this order, protrude from an isolation insulating layer, are made of semiconductor and having a cap layer, respectively;
    forming a first dummy layer over the first and second fin structures such that a first space is formed between the first dummy layer formed on the first fin structure and the first dummy layer formed on the second fin structure;
    forming a second dummy layer in the first space;
    forming a third dummy layer over the first dummy layer and the second dummy layer so that a second space is formed between the third dummy layer formed over the third fin structure and the third dummy layer formed over the fourth fin structure;
    after the third dummy layer is formed, removing the second dummy layer, thereby re-forming the first space;
    forming a first dielectric separation wall in the first space and forming a second dielectric separation wall in the second space;
    forming a fourth dummy layer over the first and third dummy layers and the first and second dielectric separation walls;
    patterning the first, third and fourth dummy layers, thereby forming a first dummy gate structure over the first and second fin structures and the first dielectric separation wall, and a second dummy gate structure over the third and fourth fin structures and the second dielectric separation wall;

forming an interlayer dielectric layer (ILD) over the first and second dummy gate structures;

removing an upper portion of the ILD layer, thereby exposing the first and second dielectric separation walls and first to fourth fin structures, and dividing the first dummy gate structure into a first sub-dummy gate structure and a second sub-dummy gate structure and dividing the second dummy gate structure into a third sub-dummy gate structure and a fourth sub-dummy gate structures; and replacing the first sub-dummy gate structure and the second sub-dummy gate structure with a first gate structure and a second gate structure, respectively, and the third sub-dummy gate structure and the fourth sub-dummy gate structure with a third gate structure and a fourth gate structure, respectively, wherein:

the first gate structure and the second gate structure are separated by the first dielectric separation wall, and the third gate structure and the fourth gate structure are separated by the second dielectric separation wall, and the first dielectric separation wall has a different width than the second dielectric separation wall.

9. The method of claim 8, wherein a pitch between the first and second fin structures is P1, a pitch between the second and third fin structures is P2, a pitch of the third and fourth fin structures is P4, where P1=2P, P2=3P and P3=4P and P is a base pitch.

10. The method of claim 8, wherein each of the first and second dielectric separation walls includes one or more layers of SiCN, zirconium oxide, aluminum oxide and hafnium oxide.

11. The method of claim 8, wherein the cap layer includes one or more layers of titanium oxide, hafnium oxide and zirconium oxide and an amorphous silicon layer formed thereon.

12. The method of claim 8, wherein the first, second, third and fourth fin structures are formed by:

forming an isolation insulating layer such that the first to third fin structures are embedded in the isolation insulating layer and the cap layer of each of the first to fourth fin structures is exposed from the isolation insulating layer;

recessing the isolation insulating layer so that upper portions of the first to fourth fin structures are exposed; and forming a cover layer over the exposed first to fourth fin structures and the cap layer;

partially removing the cover layer from the cap layer, wherein:

the cap layer includes one or more layers of titanium oxide, hafnium oxide and zirconium oxide and an amorphous silicon layer formed thereon, and the cover layer disposed on the cap layer is removed.

13. The method of claim 12, further comprising, between forming the cover layer and partially removing the cover layer, forming a sacrificial layer over the recessed isolation insulating layer so that the amorphous silicon layer protrudes from the sacrificial layer.

14. The method of claim 8, wherein:

the first dummy layer and the second dummy layer are made of polysilicon or amorphous silicon, and the second dummy layer is made of silicon nitride based material.

15. A method of manufacturing a semiconductor device, the method comprising:

forming first and second fin structures made of semiconductor, the first and second fin structures protruding from an isolation insulating layer;

forming a first dummy layer over the first and second fin structures such that a space is formed between the first dummy layer formed on the first fin structure and the first dummy layer formed on the second fin structure;

forming a dielectric separation wall in the space;

forming a second dummy layer over the first dummy layer and the dielectric separation wall;

patterning the first and second dummy layers, thereby forming a first dummy gate structure, a second dummy gate structure adjacent to the first dummy gate structure and a third dummy gate structure adjacent to the second dummy gate structure;

forming an interlayer dielectric layer (ILD) over the first, second and third dummy gate structures;

removing an upper portion of the ILD layer, thereby exposing the dielectric separation wall and dividing the first dummy gate structure into a first sub-dummy gate structure and a second sub-dummy gate structure and dividing the second dummy gate structure into a third sub-dummy gate structure and a fourth sub-dummy gate structure; and replacing the first, second, third and fourth sub-dummy gate structures with first, second, third and fourth gate structures, respectively, and replacing the third dummy gate structure with a fifth gate structure, wherein the first gate structure and the second gate structure are separated by the dielectric separation wall and the third gate structure and the fourth gate structure are separated by the dielectric separation wall, and the fifth gate structure is not separated by the dielectric separation wall.

16. The method of claim 15, wherein the dielectric separation wall includes one or more layers of SiCN, zirconium oxide, aluminum oxide and hafnium oxide.

17. The method of claim 15, wherein the first and second dummy layers are made of a same material.

18. The method of claim 17, wherein the first and second dummy layers are made of amorphous or polycrystalline material of a Group IV material.

19. The method of claim 15, further comprising before forming the first dummy layer over the first and second fin structures, forming an insulating layer over the first and second fin structures.

20. The method of claim 15, wherein a thickness of the first dummy layer on one side face of the first fin structure facing the second fin structure is smaller than a thickness of the first dummy layer on another side of the fin structure opposite to the one side.

* * * * *